US011014693B2

(12) United States Patent
Francis et al.

(10) Patent No.: US 11,014,693 B2
(45) Date of Patent: May 25, 2021

(54) EXTENDIBLE MEMBRANE SYSTEMS, DEVICES, AND METHODS FOR SPACE APPLICATIONS

(71) Applicant: Roccor, LLC, Longmont, CO (US)

(72) Inventors: William H. Francis, Lyons, CO (US); Mark S. Lake, Erie, CO (US)

(73) Assignee: Roccor, LLC, Longmont, CO (US)

( * ) Notice: Subject to any disclaimer, the term of this patent is extended or adjusted under 35 U.S.C. 154(b) by 0 days.

(21) Appl. No.: 16/028,669

(22) Filed: Jul. 6, 2018

(65) Prior Publication Data

US 2019/0071191 A1 Mar. 7, 2019

Related U.S. Application Data

(63) Continuation of application No. PCT/US2017/012470, filed on Jan. 6, 2017.
(Continued)

(51) Int. Cl.
*B64G 1/44* (2006.01)
*B64G 1/22* (2006.01)
(Continued)

(52) U.S. Cl.
CPC ............... *B64G 1/222* (2013.01); *B64G 1/44* (2013.01); *B64G 1/443* (2013.01); *E04C 3/005* (2013.01);
(Continued)

(58) Field of Classification Search
CPC . B64G 1/22; B64G 1/222; B64G 1/44; B64G 1/443
See application file for complete search history.

(56) References Cited

U.S. PATENT DOCUMENTS 3,070,699 A * 12/1962 Lehmann ................ F24S 50/20 250/206
3,149,603 A 9/1964 Sainte-Claire
(Continued)

FOREIGN PATENT DOCUMENTS

GB 2103011 2/1983
WO WO2014127292 8/2014

OTHER PUBLICATIONS

McEachen, M., et al., "Compact Telescoping Array: Advancement from Concept to Reality," AIAA SciTech Forum, Jan. 8-12, 2018.
(Continued)

*Primary Examiner* — Richard R. Green
*Assistant Examiner* — Michael A. Fabula
(74) *Attorney, Agent, or Firm* — Wilson Patent Law, LLC

(57) ABSTRACT

An extendible membrane system may include: an extendible central column; one or more membranes; and/or one or more foldable membrane supports configured to support the one or more membranes. Each of the one or more foldable membrane supports may be configured to extend from the extendible central column. In some embodiments, one or more of the one or more foldable membrane supports includes two or more segments that may be configured to couple with each other. A method of deploying one or more membranes may include unfolding one or more foldable membrane supports from a folded configuration to a linear configuration. An extendible membrane device may include one or more membranes and one or more foldable membrane supports configured to support the one or more membranes.

20 Claims, 29 Drawing Sheets

Related U.S. Application Data

(60) Provisional application No. 62/275,399, filed on Jan. 6, 2016.

(51) Int. Cl.

| | |
|---|---|
| ***E04C 3/00*** | (2006.01) |
| ***E04C 3/28*** | (2006.01) |
| ***H02S 30/20*** | (2014.01) |
| ***H01L 31/048*** | (2014.01) |
| *F24S 25/00* | (2018.01) |

(52) U.S. Cl.

CPC .............. *E04C 3/28* (2013.01); *H01L 31/048* (2013.01); *H02S 30/20* (2014.12); *F24S 2025/012* (2018.05)

(56) References Cited

U.S. PATENT DOCUMENTS

| | | | | | |
|---|---|---|---|---|---|
| 3,220,004 | A * | 11/1965 | Gillespie, Jr. | H01Q 1/081 | 342/10 |
| 3,477,662 | A * | 11/1969 | Anderson | B64G 1/443 | 244/172.7 |
| 3,503,072 | A * | 3/1970 | Thompson | B64G 1/22 | 343/705 |
| 3,525,483 | A * | 8/1970 | Alstyne | B64G 1/222 | 244/172.6 |
| 3,635,425 | A * | 1/1972 | Swet | B64G 1/222 | 244/172.7 |
| 3,677,508 | A * | 7/1972 | Dillard | B64G 1/222 | 244/172.7 |
| 3,690,080 | A * | 9/1972 | Dillard | B64G 1/222 | 52/108 |
| 3,698,958 | A * | 10/1972 | Williamson et al. | B64G 1/222 | 136/245 |
| 3,756,858 | A * | 9/1973 | Dillard | B64G 1/222 | 136/245 |
| 3,781,647 | A * | 12/1973 | Glaser | B64G 1/428 | 322/2 R |
| 3,863,870 | A | 2/1975 | Andrews | | |
| 4,015,653 | A * | 4/1977 | Slysh | H01Q 1/1235 | 160/213 |
| 4,133,502 | A * | 1/1979 | Anchutin | B64G 1/443 | 136/245 |
| 4,306,108 | A * | 12/1981 | Henesian | B64G 1/443 | 136/244 |
| 4,380,013 | A * | 4/1983 | Slysh | H01Q 1/288 | 343/753 |
| 4,561,614 | A * | 12/1985 | Olikara | B64G 1/222 | 136/245 |
| 4,690,355 | A * | 9/1987 | Hornung | B64G 1/222 | 244/172.8 |
| 4,725,025 | A * | 2/1988 | Binge | B64G 9/00 | 136/245 |
| 4,832,113 | A * | 5/1989 | Mims | B64G 1/222 | 165/41 |
| 5,104,211 | A * | 4/1992 | Schumacher | F24S 23/81 | 359/853 |
| 5,131,955 | A * | 7/1992 | Stern | B64G 1/443 | 136/245 |
| 5,235,997 | A | 8/1993 | Good | | |
| 5,273,062 | A * | 12/1993 | Mozdzanowski | A45B 3/00 | 135/16 |
| 5,833,176 | A * | 11/1998 | Rubin | B64G 1/222 | 244/172.7 |
| 6,050,526 | A * | 4/2000 | Stribling, Jr. | B64G 1/222 | 136/245 |
| 6,343,442 | B1 * | 2/2002 | Marks | B64G 1/222 | 244/172.6 |
| 6,345,482 | B1 * | 2/2002 | Warren | B64G 1/222 | 52/646 |
| 6,505,795 | B1 * | 1/2003 | Thompson | B64G 1/443 | 244/172.6 |
| 6,543,725 | B1 | 4/2003 | Meurer | | |
| 7,104,506 | B1 * | 9/2006 | Goodzeit | B64G 1/222 | 244/168 |
| 7,211,722 | B1 | 5/2007 | Murphy | | |
| 7,301,095 | B2 | 11/2007 | Murphy | | |
| 8,636,253 | B1 * | 1/2014 | Spence | B64G 1/222 | 244/172.8 |
| 8,683,755 | B1 * | 4/2014 | Spence | B64G 1/222 | 136/245 |
| 8,894,017 | B1 * | 11/2014 | Baghdasarian | B64G 1/443 | 136/245 |
| 9,120,583 | B1 * | 9/2015 | Spence | H02S 30/20 | |
| 9,185,988 | B1 * | 11/2015 | Sanchez | A47C 7/66 | |
| 9,352,853 | B2 | 5/2016 | Eskenazi | | |
| 9,550,584 | B1 * | 1/2017 | Harvey | B64G 1/222 | |
| 9,856,039 | B2 * | 1/2018 | Abrams | B64G 1/66 | |
| 10,131,452 | B1 * | 11/2018 | Rohweller | H01Q 1/1235 | |
| 10,239,642 | B1 * | 3/2019 | Spence | B64G 1/44 | |
| 2002/0112417 | A1 * | 8/2002 | Brown | B64G 1/222 | 52/108 |
| 2002/0116877 | A1 * | 8/2002 | Breitbach | B64G 1/222 | 52/2.18 |
| 2003/0000569 | A1 * | 1/2003 | Zwanenburg | B64G 1/222 | 136/251 |
| 2003/0041548 | A1 * | 3/2003 | Merrifield | B64G 1/222 | 52/646 |
| 2004/0194397 | A1 | 10/2004 | Brown | | |
| 2005/0178921 | A1 * | 8/2005 | Stribling | B64G 1/222 | 244/172.7 |
| 2007/0127231 | A1 * | 6/2007 | Li | A45B 3/04 | 362/102 |
| 2007/0242450 | A1 * | 10/2007 | Blatecky | A45B 3/04 | 362/102 |
| 2007/0283987 | A1 * | 12/2007 | Reyes | A45B 3/04 | 135/16 |
| 2008/0111031 | A1 * | 5/2008 | Mobrem | B64G 1/222 | 244/172.6 |
| 2009/0126775 | A1 | 5/2009 | White | | |
| 2009/0133355 | A1 * | 5/2009 | Mobrem | B64G 1/222 | 52/646 |
| 2009/0184207 | A1 * | 7/2009 | Warren | B64G 1/222 | 244/172.6 |
| 2010/0101172 | A1 | 4/2010 | Murphy | | |
| 2010/0269446 | A1 * | 10/2010 | Merrifield | B64G 1/22 | 52/646 |
| 2012/0216850 | A1 * | 8/2012 | Chu | H02S 30/20 | 136/245 |
| 2013/0148334 | A1 | 6/2013 | Chen | | |
| 2013/0234645 | A1 * | 9/2013 | Goei | H02S 20/00 | 320/101 |
| 2013/0263548 | A1 * | 10/2013 | Merrifield | E04C 3/02 | 52/646 |
| 2014/0028242 | A1 * | 1/2014 | Akin | H02J 7/02 | 320/101 |
| 2014/0263847 | A1 * | 9/2014 | Eskenazi | B64G 1/222 | 244/172.6 |
| 2016/0010333 | A1 * | 1/2016 | Freebury | E04C 3/005 | 52/646 |
| 2016/0122041 | A1 * | 5/2016 | Abrams | B64G 1/222 | 244/172.6 |
| 2016/0159500 | A1 * | 6/2016 | Marks | B64G 1/443 | 244/172.6 |
| 2016/0264266 | A1 * | 9/2016 | Stone | B64G 1/62 | |
| 2016/0332752 | A1 * | 11/2016 | Abrams | B64G 1/222 | |
| 2017/0063296 | A1 * | 3/2017 | Cruijssen | H02S 40/22 | |
| 2017/0104441 | A1 * | 4/2017 | Swan | F24S 25/70 | |
| 2019/0144139 | A1 * | 5/2019 | Marks | B64G 1/222 | |
| 2019/0269209 | A1 * | 9/2019 | Akin | H02J 7/0047 | |
| 2019/0305719 | A1 * | 10/2019 | Rehder | H02S 30/20 | |

OTHER PUBLICATIONS

Adler, A., et al., "PowerSail: The Challenges of Large, Planar, Surface Structures for Space Applications," 44th AIAA/ASME/ASCE/AHS Structures, Structural Dynamics, and Materials Conference, Apr. 7-10, 2003.

(56) References Cited

OTHER PUBLICATIONS

Eskenazi, M., et al., "Promising Results from Three NASA SBIR Solar ARRAY Technology Development Programs," NASA/CP-20050213431, NASA, 2005.
Botke, M., et al., "Zero Deadband, Multiple Strut Synchronized Hinge for Deployable Structures," Proceedings of the 36th Aerospace Mechanisms Symposium, May 15-17, 2002.
Mikulas, M., et al. "Telescoping Solar Array Concept for Achieving High Packing Efficiency," AIAA Spacecraft Structures Conference, Jan. 2015.
McEachen, M., et al., "Point-Focus Concentration Compact Telescoping Array," NASA/CR-2017, NASA, Apr. 2017.
Gibb, J.., "Milstar's Flexible Substrate Solar Array—Lessons Learned." 26th Aerospace Mechanisms Symposium, Goddard Space Flight Center, 1992.
Turner, G., et al., "STS 41-D Solar Array Flight Experiment," New opportunities in space; Proceedings of the Twenty-first Space Congress, Cocoa Beach, FL, Apr. 24-26, 1984 (A85-37151 17-12). pp. 8-1 to 8-10.
Banik, J., "Structural Scaling Metrics for Tensioned-Blanket Space Systems," PhD Dissertation, University of New Mexico, 2014.
Chidester, L., "Design Data Handbook for Flexible Solar Array Systems," NASA Report No. MSC-07161, NASA, Mar. 1973.
Jones, P., et al., "Spacecraft Solar Array Technology Trends," Proceedings of the IEEE Aerospace Conference, vol. 1, Aspen, Colorado, Mar. 21-28, 1998, pp. 141-152.
Hoffman, D., et al., "Concept Design of High Power Solar Electric Propulsion Vehicles for Human Exploration," NASA/TM-2011-217281, NASA, 2011.
International Search Report and Written Opinion, Int'l Appl. No. PCT/US2017/012470, dated Mar. 17, 2017, USPTO-ISA.
Lake, Mark S., et al., "Robust, Highly Scalable Array System," 3rd AIAA Spacecraft Structures Conference, American Institute of Aeronautics and Astronautics, Jan. 4-8, 2016.

* cited by examiner

EXTENDIBLE MEMBRANE SYSTEMS, DEVICES, AND METHODS FOR SPACE APPLICATIONS

GOVERNMENT LICENSE RIGHTS

This invention was made with Government support under Contract NNX14CL42P awarded by the National Aeronautics and Space Administration. The Government has certain rights in the invention.

BACKGROUND

Solar arrays have a wide variety of applications, including providing power for spacecraft. Launching and deploying solar arrays for space applications, however, may involve different issues, such as weight and volume constraints of launch capsules, exposure to extreme temperatures, and/or spacecraft maneuvering loads.

SUMMARY

Systems, devices, and methods are provided for extendible membranes, such as solar arrays or blankets for space applications. For example, some embodiments include an extendible membrane system that may include: an extendible central column; one or more membranes; and/or one or more foldable membrane supports configured to support the one or more membranes, where each of the one or more foldable membrane supports may be configured to extend from the extendible central column. In some embodiments, one or more of the one or more foldable membrane supports includes two or more segments configured to couple with each other.

In some embodiments of the system, the one or more foldable membrane supports include a first foldable membrane support and a second foldable membrane support positioned on opposite ends of a first membrane from the one or more membranes and a second membrane from the one or more membranes. The first foldable membrane support may include a first segment and a second segment; the first segment of the first foldable membrane support may be coupled with a first end of the first membrane and the second segment of the first foldable membrane support may be coupled with a first end of the second membrane. The second foldable membrane support may include a first segment and a second segment; the first segment of the second foldable membrane support may be coupled with a second end of the first membrane and the second segment of the second foldable membrane support may be coupled with a second end of the second membrane. In some embodiments, the first foldable membrane support, the second foldable membrane support, the first membrane, and/or the second membrane are configured to store in a sandwiched configuration with each respective membrane folded in an accordion configuration.

In some embodiments of the system, the one or more foldable membrane supports include a first foldable membrane support and a second foldable membrane support positioned on opposite sides of the extendible central column. The extendible central column may include a telescoping truss column, for example. Other examples of extendible central columns may include at least a rollable column, a foldable column, a coilable column, or an articulated truss column. The extendible central column may include a lattice structure. In some embodiments, the extendible central column is configured to have a compression load ratio less than or equal to 30%.

In some embodiments of the system, the one or more membranes include one or more photovoltaic arrays or blankets. Each of the one or more membranes may be configured to fold up between one or more segments of two foldable membrane supports from the one or more foldable membrane supports. Each of the one or more membranes may be configured to roll up between one or more segments of two foldable membrane supports from the one or more foldable membrane supports.

Some embodiments of the system include one or more guy wires coupled with at least a portion of the extendible central column and with at least a portion of one or more of the one or more foldable membrane supports. At least one of the one or more guy wires may be positioned out of plane with respect to a plane defined by the one or more membranes in an extended state.

In some embodiments of the system, the one or more foldable membrane supports include a first foldable membrane support, a second foldable membrane support, a third foldable membrane support, and a fourth foldable membrane support, wherein each of the foldable membrane supports includes at least two segments and/or the first foldable membrane support and the second foldable membrane support are configured to extend from a first side of the extendible central column; and/or the third foldable membrane support and the fourth foldable membrane support are configured to extend from a second side of the extendible central column.

In some embodiments of the system, the two or more segments of each of the one or more foldable membrane supports are configured as V-fold configurations. Each of the V-fold configurations may be configured to stow on a respective side of the extendible central column.

In some embodiments of the system, the two or more segments of each of the one or more foldable membrane supports are configured to deploy from a folded configuration to a linear configuration, wherein each linear configuration extends in a respective direction perpendicular to the extendible central column. In some embodiments, each of the one or more foldable membrane supports includes a first segment and a second segment, wherein: a first end portion of the first segment of a respective foldable membrane support is coupled with the extendible central column; and/or a second end portion of the first segment of the respective foldable membrane support is coupled with a first end portion of the second segment of the respective foldable membrane support.

In some embodiments of the system, each of the one or more foldable membrane supports is configured to unfold and extend in a respective linear direction perpendicular to the extendible central column. In some embodiments of the system, each of the one or more foldable membrane supports includes three or more segments coupled with each other in a Z-fold configuration. In some embodiments of the system, the one or more foldable membrane supports and the one or more membranes are configured such that the one or more membranes deploy from a stowed state to a deployed state after the extendible central column is extended.

Some embodiments include a method of deploying one or more membranes that may include unfolding one or more foldable membrane supports from a folded configuration to a linear configuration. The method may include coupling at least a portion of at least one of the one or more foldable membrane supports with extendible central column.

Some embodiments further include extending the extendible central column in a longitudinal direction with respect to at least one of the unfolded foldable membrane supports in the linear configuration. At least one of the one or more unfolded foldable membrane supports in the linear configuration may move longitudinally with respect to one or more of the other unfolded foldable membrane supports in the linear configuration as the extendible central column is extended.

Some embodiments of the method include extending the one or more membranes in the longitudinal direction as the extendible central column is extended; at least a portion of each of the one or more membranes may be coupled with a portion of at least one of the one or more foldable membrane supports. Some embodiments of the method include extending the one or more membranes in the longitudinal direction after the extendible central column is extended; at least a portion of each of the one or more membranes may be coupled with a portion of at least one of the one or more foldable membrane supports.

Some embodiments of the method include retracting at least the extendible central column, the one or more unfolded foldable membrane supports, or the one or more membranes. The one or more membranes may include one or more photovoltaic arrays or blankets.

Some embodiments of the method include moving two or more of the unfolded foldable membrane supports away from each other. Some embodiments further include deploying the one or more membranes between the two or more of the unfolded foldable membrane supports. Deploying the one or more membranes between the two or more of the unfolded foldable membrane supports may occur after moving the two or more of the unfolded foldable membrane supports away from each other. Deploying the one or more membranes between the two or more of the unfolded foldable membrane supports may occur as two or more of the unfolded foldable membrane supports are moved away from each other. Some embodiments include retracting the one or more membranes.

In some embodiments of the method, one or more of the one or more unfoldable membrane supports includes two or more segments coupled with each other. In some embodiments, one or more of the one or more foldable membrane supports are configured to couple with an extendible central column. In some embodiments, the one or more foldable membrane supports may unfold from at least a V-fold configuration to a linear configuration. The one or more foldable membrane supports unfold from at least a Z-fold configuration to a linear configuration.

In some embodiments of the method, the one or more foldable membrane supports include a first foldable membrane support, a second membrane support, a third membrane support, and a fourth membrane support, wherein each of the foldable membrane supports includes at least two segments and/or: the first foldable membrane support and the second foldable membrane support are configured to extend from a first side of the extendible central column; and/or the third foldable membrane support and the fourth foldable membrane support are configured to extend from a second side of the extendible central column.

In some embodiments of the method, each of the V-fold configurations is configured at least to stow on a respective side of the extendible central column or to extend from the respective side of the extendible central column. In some embodiments, the two or more segments of each of the one or more foldable membrane supports are configured to deploy from a folded configuration to a linear configuration, wherein each linear configuration may extend in a respective direction perpendicular to the extendible central column. In some embodiments, each of the one or more foldable membrane supports includes a first segment and a second segment, wherein: a first end portion of the first segment of a respective foldable membrane support is coupled with the extendible central column; and/or a second end portion of the first segment of the respective foldable membrane support is coupled with a first end portion of the second segment of the respective foldable membrane support. In some embodiments, each of the one or more foldable membrane supports is configured to unfold and extend in a respective linear direction perpendicular to the extendible central column.

Some embodiments include an extendible membrane device that may include: one or more membranes; and/or one or more foldable membrane supports configured to support the one or more membranes. One or more of the one or more foldable membrane supports may include two or more segments configured to couple with each other. The two or more segments may be coupled with each other utilizing at least a hinge or a latch.

In some embodiments of the device, the one or more foldable membrane supports include a first foldable membrane support and a second foldable membrane support positioned on opposite ends of a first membrane from the one or more membranes and a second membrane from the one or more membranes. The first foldable membrane support may include a first segment and a second segment; the first segment of the first foldable membrane support may be coupled with a first end of the first membrane and the second segment of the first foldable membrane support may be coupled with a first end of the second membrane. The second foldable membrane support may include a first segment and a second segment; the first segment of the second foldable membrane support may be coupled with a second end of the first membrane and the second segment of the second foldable membrane support may be coupled with a second end of the second membrane. In some embodiments, the first foldable membrane support, the second foldable membrane support, the first membrane, and/or the second membrane are configured to store in a sandwiched configuration.

In some embodiments of the device, each of the one or more foldable membrane supports includes three or more segments; the three or more segments may be configured to couple with each other and/or to store in a Z-fold configuration. In some embodiments, the one or more membranes include one or more photovoltaic arrays. In some embodiments, the length to width ratio of the deployed extendible membrane device is less than or equal to three.

In some embodiments of the device, the one or more foldable membrane supports are configured to couple with an extendible central column. In some embodiments, the one or more foldable membrane supports are configured unfold from at least a V-fold configuration to a linear configuration. In some embodiments, the one or more foldable membrane supports include a first foldable membrane support and a second membrane support and wherein each of the foldable membrane supports includes at least two segments and the first foldable membrane support and the second foldable membrane support are configured to extend from a first side of an extendible central column. In some embodiments, each of the one or more foldable membrane supports includes two or more segments of each of the one or more foldable membrane supports are configured as at least V-fold configurations. In some embodiments, each of the V-fold configurations is configured at least to stow on a respective side of an extendible central column or to extend from the respective side of the extendible central column. In some embodiments, the two or more segments of each of the one or more foldable membrane supports are configured to deploy from a folded configuration to a linear configuration, wherein each linear configuration is configured to extend in a respective direction perpendicular to an extendible central column. In some embodiments, each of the one or more foldable membrane supports includes a first segment and a second segment, wherein: a first end portion of the first segment of a respective foldable membrane support is configured to coupled with an extendible central column; and/or a second end portion of the first segment of the respective foldable membrane support is coupled with a first end portion of the second segment of the respective foldable membrane support. In some embodiments, each of the one or more foldable membrane supports is configured to unfold and extend in a respective linear direction perpendicular to an extendible central column.

Some embodiment include methods, systems, and/or devices as described in the specification and/or shown in the figures.

The foregoing has outlined rather broadly the features and technical advantages of embodiments according to the disclosure in order that the detailed description that follows may be better understood. Additional features and advantages will be described hereinafter. The conception and specific embodiments disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of different embodiments may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
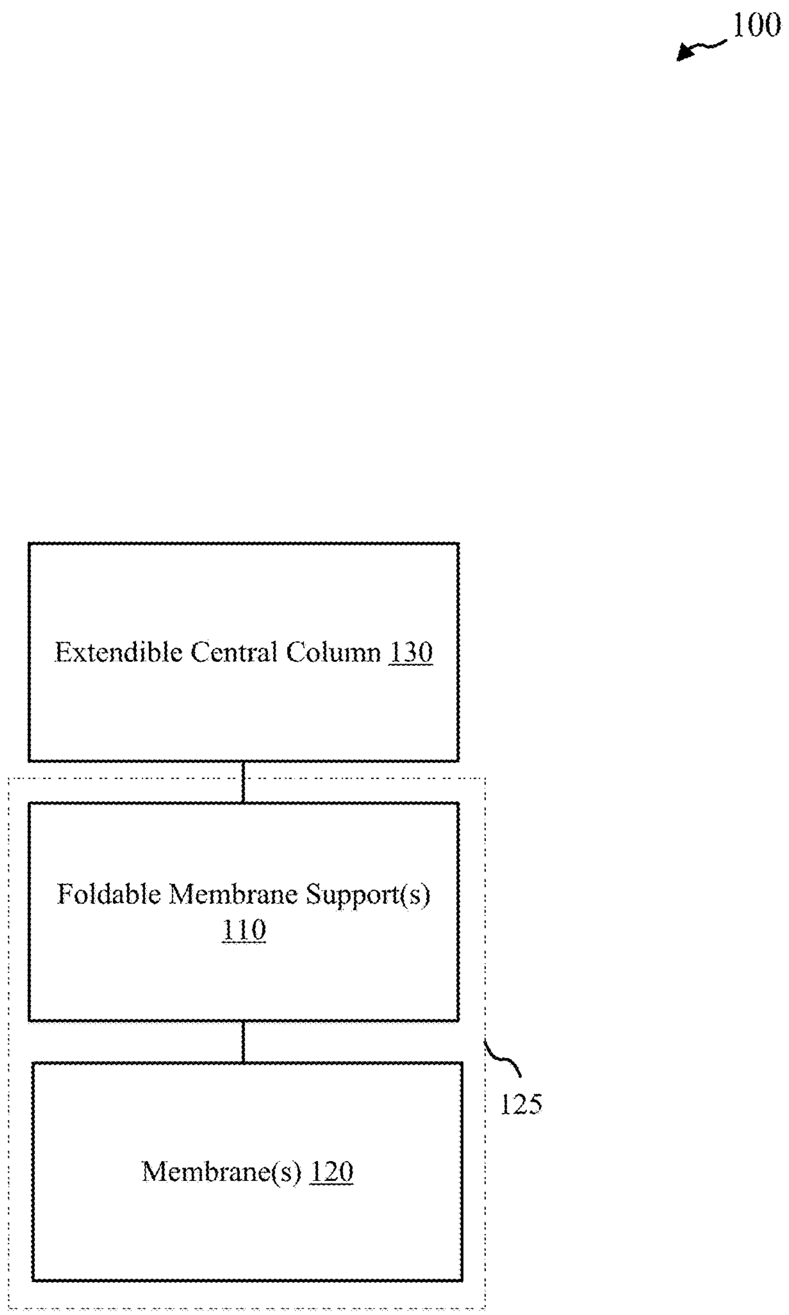
FIG. 1 shows a system in accordance with various embodiments.

This description provides embodiments, and is not intended to limit the scope, applicability or configuration of the disclosure. Rather, the ensuing description will provide those skilled in the art with an enabling description for implementing embodiments of the disclosure. Various changes may be made in the function and arrangement of elements.

Thus, various embodiments may omit, substitute, or add various procedures or components as appropriate. For instance, it should be appreciated that the methods may be performed in an order different than that described, and that various stages may be added, omitted or combined. Also, aspects and elements described with respect to certain embodiments may be combined in various other embodiments. It should also be appreciated that the following systems, devices, and methods may individually or collectively be components of a larger system, wherein other procedures may take precedence over or otherwise modify their application.

Extendible membrane systems, devices, and methods are provided in accordance with various embodiments. These systems, devices, and methods may provide for robust, highly scalable solar arrays, for example. Space applications may be particularly applicable with respect to these systems, devices, and/or methods.

Some embodiments may provide a variety of improvements and/or advantages over other systems, devices, and methods. These may include, but are not limited, to the following aspects. Transverse folding of membranes, such as photovoltaic array blankets or other solar cell technologies, and foldable membrane supports, such as spreader bars, may enable lower deployed aspect ratio and a smaller packaged size. Some embodiments may include purposeful design of ratio of deployed compression strength of column to membrane tension in membranes. Furthermore, the use of open cross-section extendible central columns in some embodiments may help eliminate thermal bow and/or minimize nonlinear deployed dynamics.

The systems, devices, and/or methods provided may utilize tensioned-blanket arrays, which may build from the design heritage embodied by the International Space Station (ISS) solar arrays and may advance the development of Compact Telescoping Arrays (CTA), for example. Some embodiments may utilize Flexible Substrate Solar Arrays (FSSA). The systems, devices, and methods provided may incorporate hierarchical features that may significantly improve the stowed volume and/or substantially increase the deployed stiffness of some embodiments.

Embodiments may be configured for generating up to 1 MW of power. This power generation may be useful in applications including, but not limited to, Solar Electric Propulsion (SEP) missions. Higher power may be generated in some embodiments, while some embodiments may be configured for lower power generation.

Some embodiments may be configured for deployed fundamental frequency of 0.1 Hz and strength of 0.2 g. The use of guy wires in some embodiments to strengthen different systems and devices may facilitate meeting these metrics, though other aspects of design may facilitate meeting these metrics. Some embodiments may be designed based on other values for these metrics.

Some embodiments may include double transverse folding of array blankets, or membranes more generally, and spreader bars, or foldable membrane supports more generally, which may enable lower deployed aspect ratio for higher structural efficiency and a smaller packaged size. Some embodiments may include other folding values such as triple, quadruple, or higher values with regard to the folding. Some embodiments may involve the purposeful selection of the ratio of deployed compression strength of column to PV blanket tension (a range of $0.02<q<0.2$ may be practical with the lower loads likely to be more desirable due to the fact that this may reduce design complexity of spreader bar assembly, though values of q less than or equal to 0.3 may also be applicable; some embodiments may utilize values of q greater than 0.3). Some embodiments may utilize an open cross-section central truss column, which may help achieve a structural mass performance index value of $\mu=500$ while also eliminating thermal bow and minimizing nonlinear deployed dynamics; some embodiments may be configured from other values of $\mu$.

Merely by way of example, one embodiment utilizing a central truss boom with a structural mass performance index value of $\mu=500$ may be configured for 500 kW of power per extendible membrane system or spacecraft wing (1 MW for a spacecraft with two extendible membrane systems or two spacecraft wings), with a specific power of 200 W/kg. The aspect ratio (l/w) for the system may be 2.5:1. The packing efficiency may be 50 kW/m$^3$. The deployed stiffness may be 0.1 Hz and the deployed strength may be 0.2 g. These values are for illustration purposes only; other embodiments be configured to produce different values. The embodiments as reflected in FIGS. 6A-6D may provide an example of a system configured with these illustrative values.

Some embodiments may address different problems with regard to solar array deployment for space applications. For example, one major driver for solar array structural mass fraction (i.e., the ratio of the mass of the support structure to the total system mass) may be the volumetric packaging factor. In other words, it may be observed that as the array may be stowed in a smaller volume, the resulting primary support structure may be smaller and accordingly less efficient, which may drive the structural mass fraction up dramatically for mega-watt-scale designs. In order to meet either 0.1 Hz or 0.075 Hz minimum deployed frequency parameters, for example, it may be estimated that the structural mass fractions may have to be excessively high in order to maintain the system packaging density of 60 kW/m$^3$. Practically, this constraint may prevent the diameter of the central boom from getting larger and may force the boom's wall thickness to be increased above minimum gage in order to achieve the higher bending stiffness that may be involved at larger array sizes.

Some embodiments may address issues like the non-uniform heating and potential thermal bowing of the central column structure due to solar heating. Some embodiments may facilitate minimizing such deformations and the possibility of inducing system nonlinear dynamics.

Some embodiments may address the structural performance of tensioned-blanket solar arrays with respect to their fundamental deployed vibration frequency. Some embodiments may be configured for a range of values for blanket tension (approximately $0.05<q<0.3$) for which the fundamental frequency of the system may be greatest for a given central column design and system mass distribution. In some cases, an optimum value for blanket tension may be approximately on the order of 20% to 25% of the compression strength of the central column; this condition may result in a fundamental mode shape that may be highly coupled between bending and torsion. For practical reasons, it may be desirable to adjust the system design such that the operating blanket tension is closer to 10% of the central column compression strength; this may help produce a fundamental mode shape that may be blanket dominated and may minimize overall system preload in order to preserve strength margin to resist operational loads.

Some embodiments may utilize tensioned guy wires. This may improve the bending stiffness of slender central columns without adding significant mass. However, adding guy wires may increase the complexity of some systems and devices. Some embodiments may be designed utilizing a central column with foldable membrane supports with sufficient stiffness and/or strength to meet the performance desired without the use of tensioned guy wires.

Turning now to FIG. 1, an extendible membrane system 100 is provided in accordance with various embodiments. Some 100 may include an extendible central column 130. System 100 may include one or more membranes 120. System 100 may include one or more foldable membrane supports 110 that may be configured to support the one or more membranes 120. Each of the one or more foldable membrane supports 110 may be configured to extend from the extendible central column 130. In some embodiments of the system 100, one or more of the one or more foldable membrane supports 110 includes two or more segments configured to couple with each other. The combination of at least the one or more membranes 120 and the one or more foldable membrane supports 110 may be referred to in some cases as an extendible membrane device 125.

In some embodiments, the one or more foldable membrane supports 110 include a first foldable membrane support and a second foldable membrane support positioned on opposite ends of a first membrane from the one or more membranes and a second membrane from the one or more membranes 120. The first foldable membrane support may include a first segment and a second segment; the first segment of the first foldable membrane support may be coupled with a first end of the first membrane and the second segment of the first foldable membrane support may be coupled with a first end of the second membrane. The second foldable membrane support may include a first segment and a second segment; the first segment of the second foldable membrane support may be coupled with a second end of the first membrane and the second segment of the second foldable membrane support may be coupled with a second end of the second membrane. In some embodiments, the first foldable membrane support, the second foldable membrane support, the first membrane, and/or the second membrane are configured to store in a sandwiched configuration with each respective membrane folded in an accordion configuration.

In some embodiments, the one or more foldable membrane supports 110 include a first foldable membrane support and a second foldable membrane support positioned on opposite sides of the extendible central column 130. The extendible central column 130 may include a telescoping truss column, for example. Other examples of extendible central columns 130 may include at least a rollable column, a foldable column, a coilable column, or an articulated truss column. The extendible central column 130 may include a lattice structure. In some embodiments, the extendible central column 130 is configured to have a compression load ratio less than or equal to 30%. Some embodiments may be configured for a compression load ratio between 20% and 25%; other embodiments may be configured for a compression load ratio less than or equal to 10%.

In some embodiments, the one or more membranes 120 include one or more photovoltaic arrays. Each of the one or more membranes 120 may be configured to fold up between one or more segments of two foldable membrane supports from the one or more foldable membrane supports 110. Each of the one or more membranes 120 may be configured to roll up between one or more segments of two foldable membrane supports from the one or more foldable membrane supports 110 in some embodiments.

Some embodiments include one or more guy wires coupled with at least a portion of the extendible central column 130 and with at least a portion of one or more of the one or more foldable membrane supports 110. At least one of the one or more guy wires may be positioned out of plane with respect to a plane defined by the one or more membranes 120 in an extended state.

In some embodiments of the system 100, the one or more foldable membrane supports 110 include a first foldable membrane support, a second membrane support, a third membrane support, and a fourth membrane support; each of the foldable membrane supports 110 may include at least two segments and/or the first foldable membrane support and the second foldable membrane support may be configured to extend from a first side of the extendible central column 130 and/or the third foldable membrane support and the fourth foldable membrane support may be configured to extend from a second side of the extendible central column 130.

In some embodiments of the system 100, the two or more segments of each of the one or more foldable membrane supports 110 are configured as V-fold configurations. Each of the V-fold configurations may be configured to stow on a respective side of the extendible central column 130.

In some embodiments of the system 100, the two or more segments of each of the one or more foldable membrane supports 110 are configured to deploy from a folded configuration to a linear configuration; each linear configuration may extend in a respective direction perpendicular to the extendible central column 130. In some embodiments, each of the one or more foldable membrane supports 110 includes a first segment and a second segment; a first end portion of the first segment of a respective foldable membrane support 110 may be coupled with the extendible central column 130 and/or a second end portion of the first segment of the respective foldable membrane support 110 may be coupled with a first end portion of the second segment of the respective foldable membrane support 110.

In some embodiments of the system 100, each of the one or more foldable membrane supports 110 is configured to unfold and extend in a respective linear direction perpendicular to the extendible central column 130. In some embodiments of the system 100, each of the one or more foldable membrane supports 110 includes three or more segments coupled with each other in a Z-fold configuration. In some embodiments of the system 100, the one or more foldable membrane supports 110 and the one or more membranes 120 are configured such that the one or more membranes 120 deploy from a stowed state to a deployed state after the extendible central column 130 is extended.

Turning now to FIG. 2A, FIG. 2B, FIG. 2C, FIG. 2D, FIG. 2E, and FIG. 2F, a system 200 in accordance with various embodiments is provided. System 200 may be reflected in these figures as a sequence (200-*a*, 200-*b*, 200-*c*, 200-*d*, 200-*e*, and/or 200-*f*) of deployment stages of the system 200 in general. System 200 may be an example of system 100 of FIG. 1.

Figure 2B:
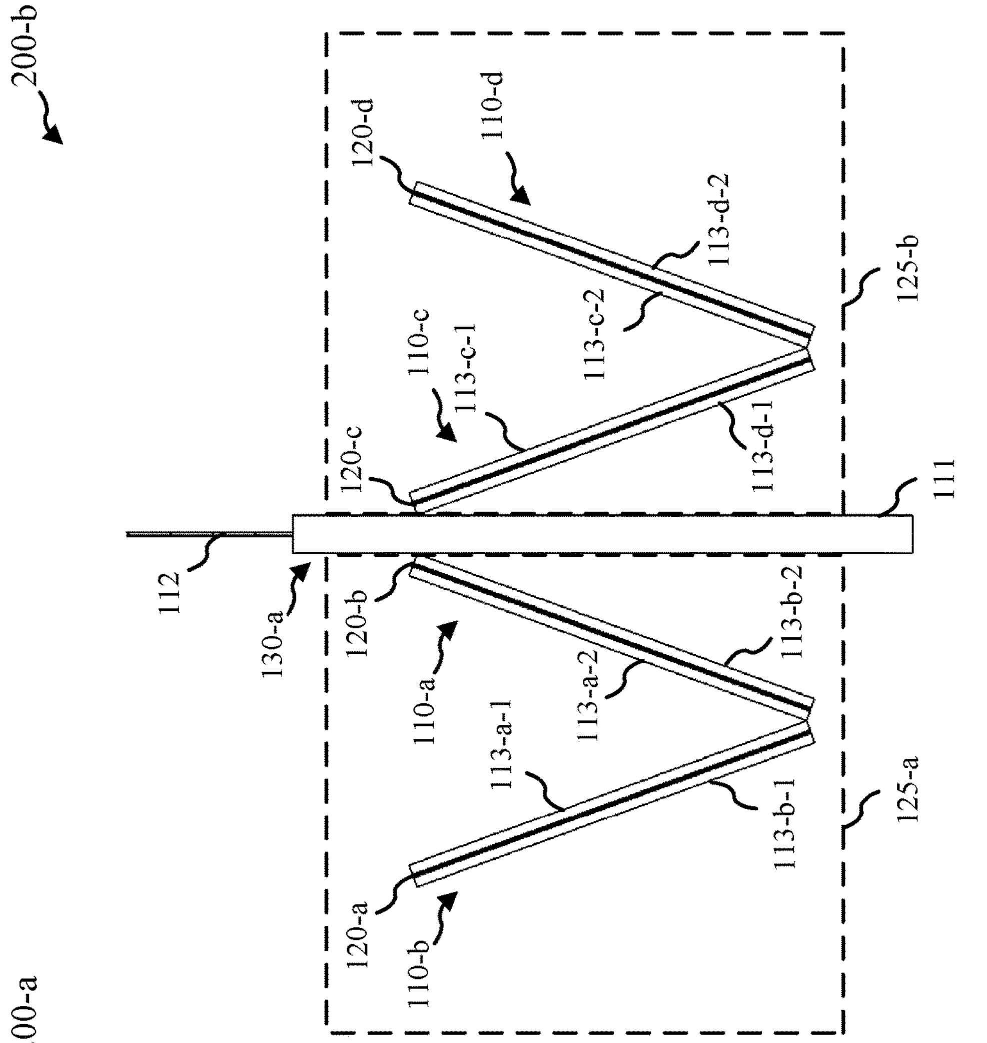
FIGS. 2A, 2B, 2C, 2D, 2E, and 2F show systems in accordance with various embodiments.
Figure 2A:
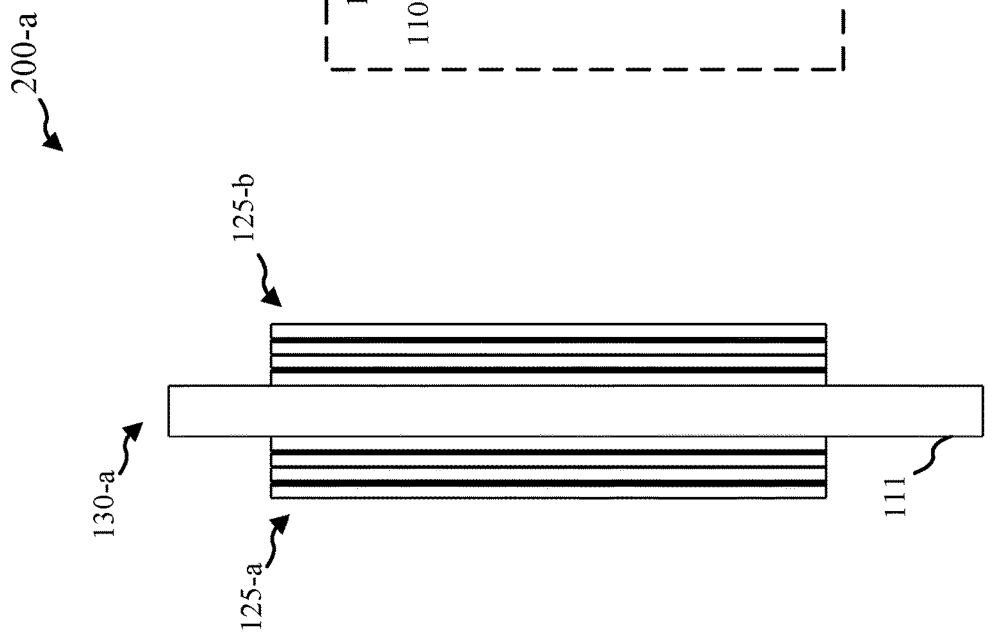

In FIG. 2A, the system 200 as shown as system 200-*a* may reflect the system in a stowed configuration. Two extendible membrane devices 125-*a*, 125-*b* may be shown; each may utilize double-folded membrane supports; each foldable membrane support may include two or more segments. Extendible membrane devices 125-*a* and/or 125-*b* may be examples of extendible membrane device 125 of FIG. 1. Each respective foldable membrane support may be associated with a respective membrane. Subsequent figures may identify these specific elements in more detail. System 200-*a* may include an extendible central column 130-*a*. In some cases, the portion of the column 110-*a* shown in FIG. 2A may be referred to as a canister 111; the canister 111 may be configured as an outer housing or casing for the extendible central column 130-*a*; the canister 111 may be considered as part of the extendible central column 130-*a*. The foldable membrane supports may be referred to as double-folded spreader bars in some cases; this may be referred to as a V-fold configuration in some cases. The V-fold configurations may be configured to stow on a respective side of the extendible central column 130-*a*. Some embodiments may include additional folded segments, such as a triple-folded spreader bar or quadruple-folded spreader bar; some embodiments may be configured with higher fold values.

In FIG. 2B, the foldable membrane supports, or double-folded spreader bars (shown as 110-*a*, 110-*b* for device 125-*a*; 110-*c*, 110-*d* for device 125-*b*) may be released from tie-down fixtures that may hold them to the portion of the extendible central column canister 111 and unfolded laterally. Each of the foldable membrane supports 110-*a*, 110-*b*, 110-*c*, and 110-*d* may include two segments; for example, support 110-*a* may include segments 113-*a*-1 and 113-*a*-2, support 110-*b* may include segments 113-*b*-1 and 113-*b*-2, support 110-*c* may include segments 113-*c*-1 and 113-*c*-2, and/or support 110-*d* may include segments 113-*d*-1 and 113-*d*-2. In some embodiments of the system 200-*b*, the two or more segments 113 of each of the one or more foldable membrane supports 110-*a*, 110-*b*, 110-*c*, and 110-*d* are configured as V-fold configurations as may be seen in FIG. 2B. Each of the V-fold configurations may be configured to stow on a respective side of the extendible central column, as may be shown in FIG. 2A.

A portion 112 of the extendible central column 130-*a* may start to deploy longitudinally. In some cases, the portion 112 may pick up the outboard folded membrane supports 110-*a* and/or 110-*c* and unfolding them via tension cables (not shown; see FIG. 3, FIG. 4A, and/or FIG. 4B, for example). The extendible central column 130-*a* may include telescoping design, though other designs may be utilized. Merely by way of example, a telescoping deployment architecture may be useful when a collapse to roughly one tenth of its deployed length may be utilized. FIG. 2B also shows membranes 120-*a*, 120-*b*, 120-*c*, and 120-*d* in a stored state between respective foldable membrane supports 110-*a*, 110-*b*, 110-*c*, and/or 110-*d*.

System 200-*b* may be an example where one or more foldable membrane supports include a first foldable membrane support 110-*a*, a second membrane support 110-*b*, a third membrane support 110-*c*, and a fourth membrane support 110-*d*, where each of the foldable membrane supports includes at least two segment. Furthermore, the first foldable membrane support 110-*a* and the second foldable membrane support 110-*b* may be configured to extend from a first side (e.g., a left side as shown in FIG. 2B) of the extendible central column 130-*a* (with respect to canister 111 of column 130-*a* in this example). Furthermore, the third foldable membrane support 110-*c* and the fourth foldable membrane support 110-*d* may be configured to extend from a second side (e.g., a right side as shown in FIG. 2B) of the extendible central column 130-*a*.

Figure 2C:
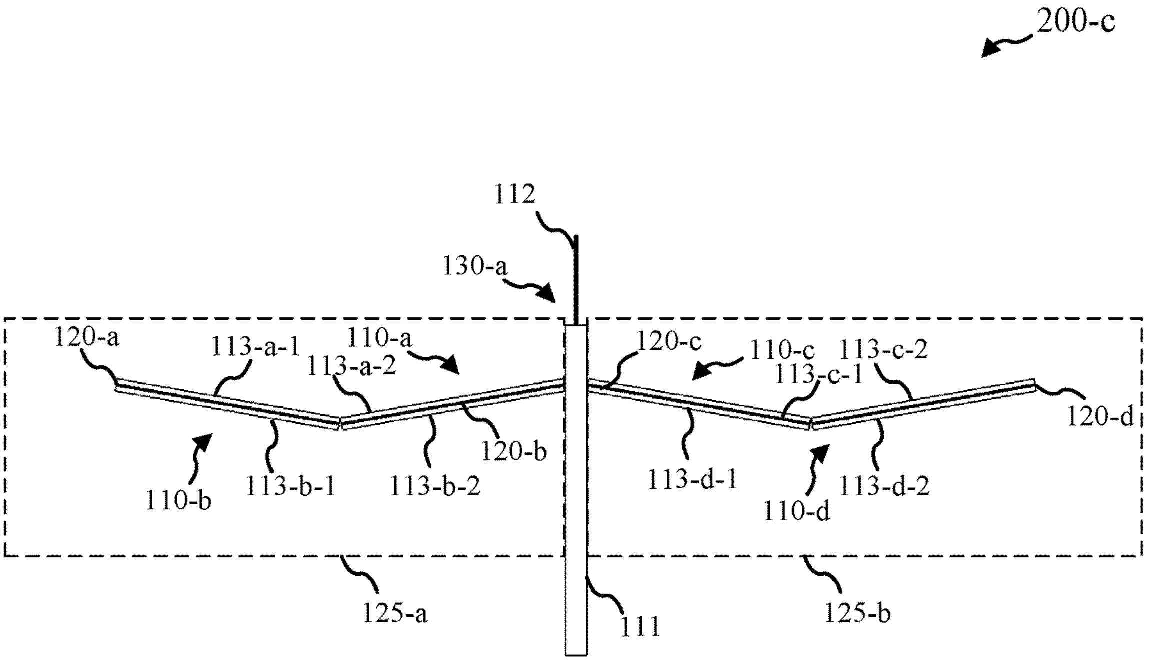
Figure 2D:
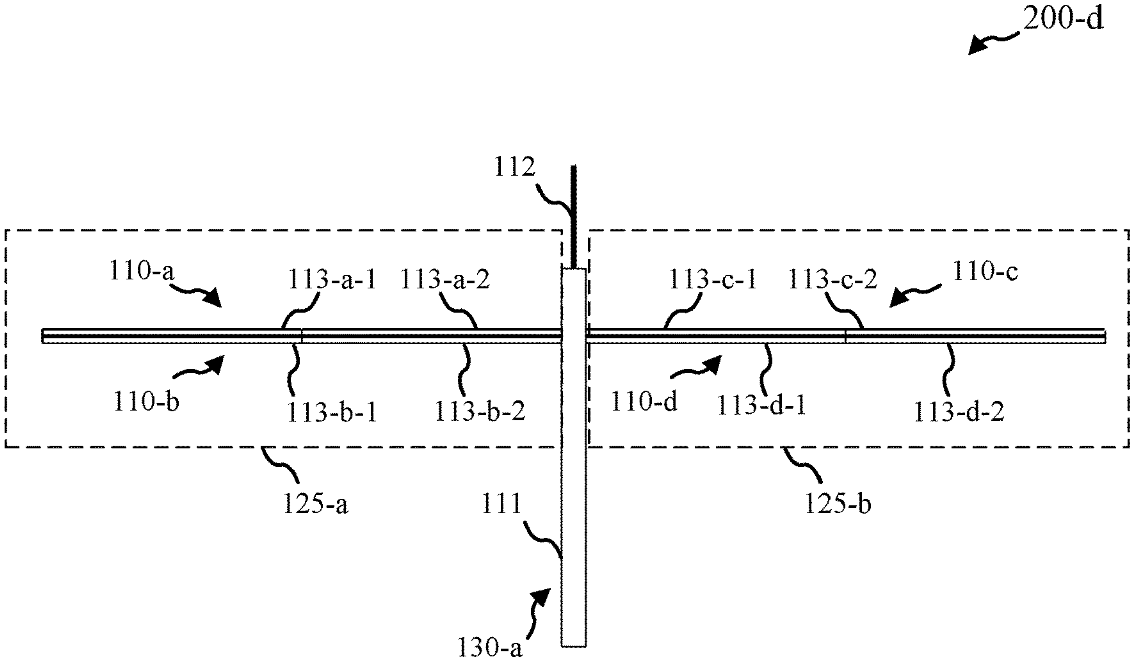

FIG. 2C and FIG. 2D go onto show the progression to a full transverse extension of the foldable membrane supports 110-*a*, 110-*b*, 110-*c*, and 110-*d* from a folded configuration to a linear configuration. For example, the two or more segments of each of the one or more foldable membrane supports 110-*a*, 110-*b*, 110-*c*, and 110-*d* may be configured to deploy from a folded configuration to a linear configuration (as may be seen in FIG. 2D); each linear configuration may extend in a respective direction perpendicular to the extendible central column 130-*a* (or canister 111, in particular). In some embodiments as noted, each of the one or more foldable membrane supports 110-*a*, 110-*b*, 110-*c*, and 110-*d* may include a first segment and a second segment; for example, support 110-*a* may include segments 113-*a*-1 and 113-*a*-2, support 110-*b* may include segments 113-*b*-1 and 113-*b*-2, support 110-*c* may include segments 113-*c*-1 and 113-*c*-2, and/or support 110-*d* may include segments 113-*d*-1 and 113-*d*-2.

In some embodiments, a first end portion (right end from perspective of FIG. 2C) of the first segment (e.g., 113-*a*-2 and 113-*b*-2) of a respective foldable membrane support (110-*a* and 110-*b*) may be coupled with the extendible central column 130-*a*. A second end portion (left end from perspective of FIG. 2C) of the first segment (e.g., 113-*a*-2) of the respective foldable membrane support (e.g., 110-*a*) may be coupled with a first end portion (right end from the perspective of FIG. 2C) of the second segment (e.g., 113-*a*-1) of the respective foldable membrane support (e.g., 110-*a*). One may note that a second end portion (left end from perspective of FIG. 2C) of the first segment (e.g., 113-*b*-2) of the respective foldable membrane support (e.g., 110-*b*) may be coupled with a first end portion (right end from the perspective of FIG. 2C) of the second segment (e.g., 113-*b*-1) of the respective foldable membrane support (e.g., 110-*b*), though this coupling may not occur in some cases until the member is fully extended in some cases (as may be shown in FIG. 2D). This may be achieved with a latch in some embodiments. A similar configuration may also be seen with respect to foldable membrane supports 110-*c* and 110-*d* along with segments 113-*c*-1, 113-*c*-2, 113-*d*-1, and 113-*d*-2, for example.

As may shown through the sequence of FIGS. 2A, 2B, 2C, and/or 2D, each of the one or more foldable membrane supports 110-*a*, 110-*b*, 110-*c*, and/or 110-*d* may be configured to unfold and extend in a respective linear direction perpendicular to the extendible central column 130-*a*. In some embodiments of the system, each of the one or more foldable membrane supports 110 includes three or more segments 113 coupled with each other in a Z-fold configuration.

Figure 2F:
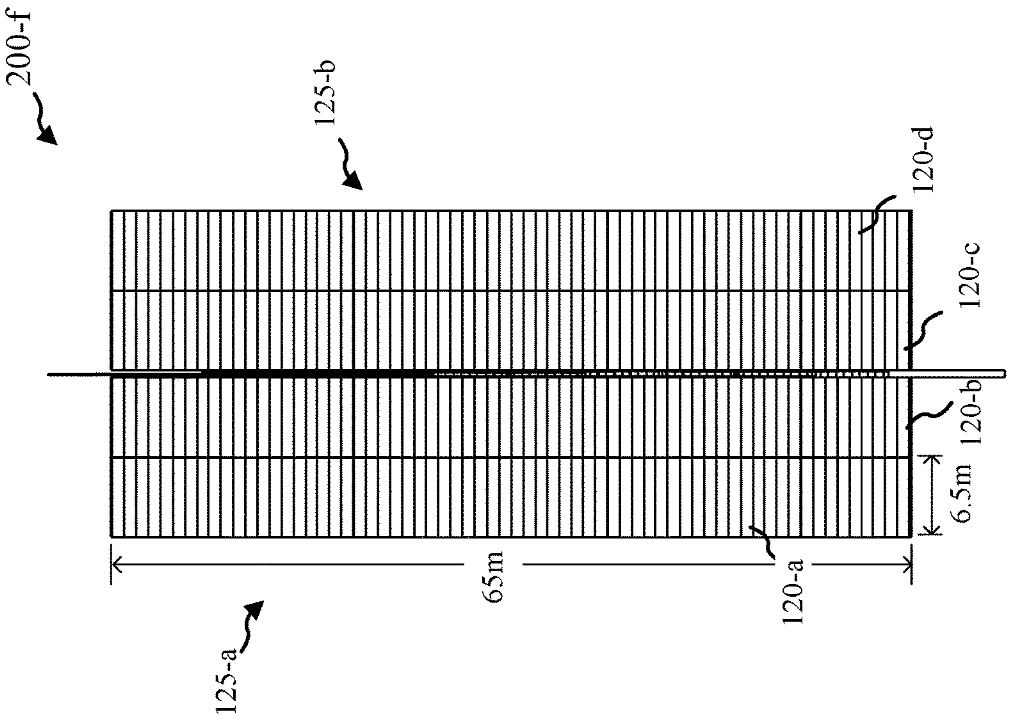
Figure 2E:
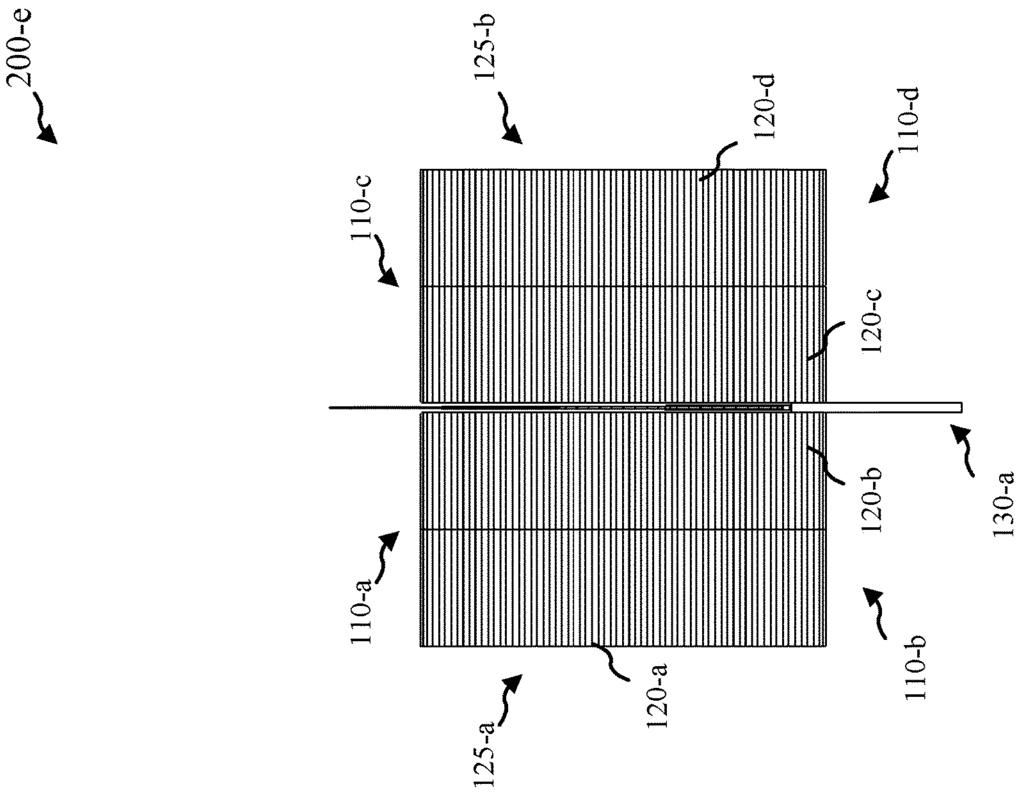

FIG. 2E and FIG. 2F generally show the extension of extendible central column 130-*a* and membranes 120-*a*, 120-*b*, 120-*c*, and/or 120-*d* from extendible membrane devices 125-*a* and 125-*b*. In particular, membranes 120-*a* and 120-*b* may extend between foldable membrane supports 110-*a* and 110-*b*, while membranes 120-*c* and 120-*d* may extend between foldable membrane supports 110-*c* and 110-*d*. While FIG. 2F may show the length of the extended membrane as 65 meters and the width 6.5 meters, these are merely for example purposes. Other lengths and widths may be utilized. One may note that in this example, the length to width ratio of the combined extendible membrane devices 125-*a* and 125-*b* may be 2.5 to 1. Some embodiments may be configured to have a length to width ratio of less than or equal to three to one. In some embodiments of the system, the one or more foldable membrane supports 110 and the one or more membranes 120 are configured such that the one or more membranes deploy from a stowed state to a deployed state as the extendible central column 130 is extended as may be shown in FIG. 2E and FIG. 2F, though in some embodiments the membranes may deploy after the extendible central column is extended.

Figure 3:
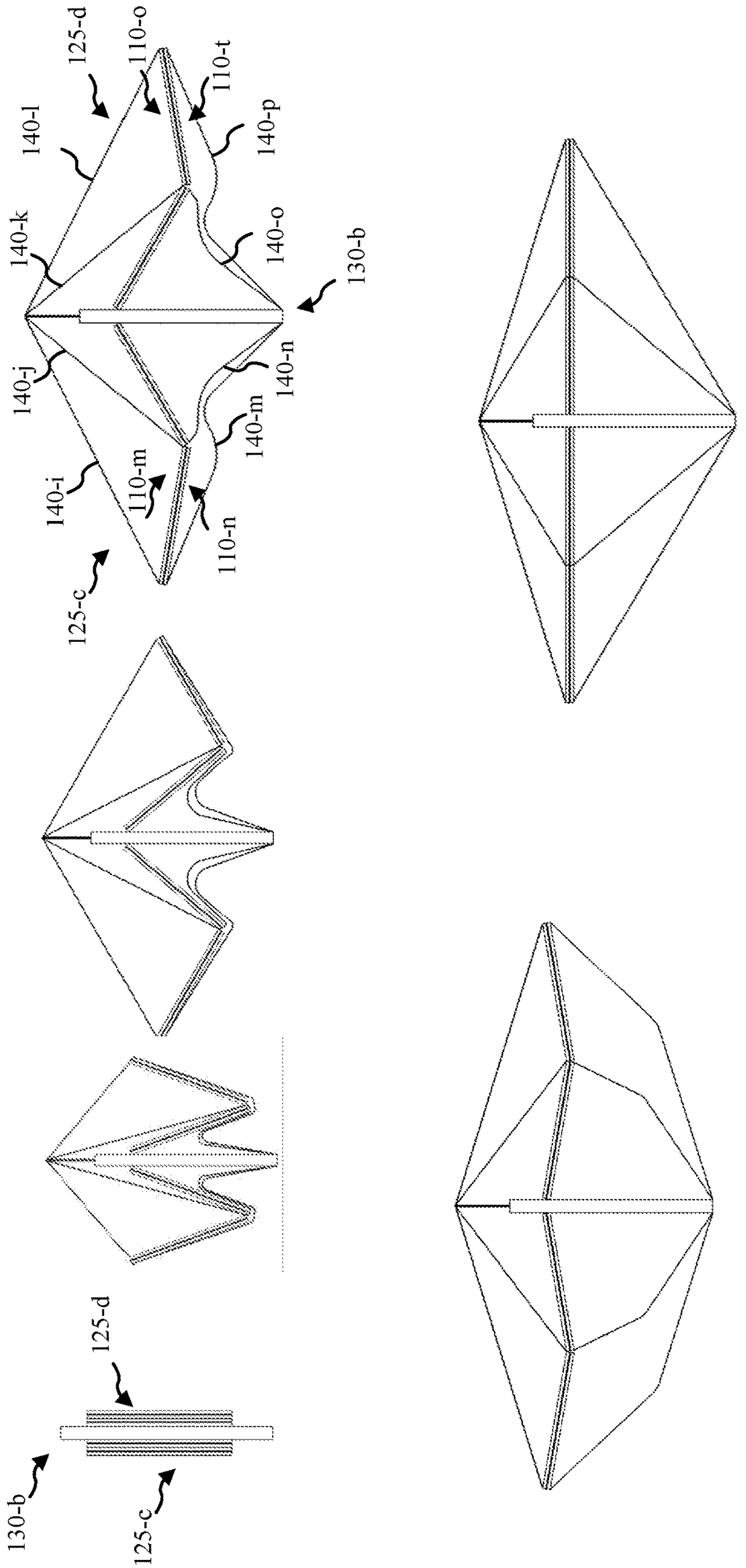
FIG. 3 shows systems in accordance with various embodiments.

FIG. 3 shows a system 300 in multiple stages of deployment in accordance with various embodiments, similar to system 200 of FIGS. 2A-2F. In system 300, guy wires 140-*i*, 140-*j*, 140-*k*, 140-*l*, 140-*m*, 140-*n*, 140-*o*, and/or 140-*p* may be provided. The guy wires 140 in general may facilitate the deployment of the extendible membrane system 300 and/or extendible membrane device 125-*c* and/or 125-*d*, which may be examples of extendible membrane device 125 of FIG. 1 and/or extendible membrane device 125-*a* and/or 125-*b* of FIGS. 2A-2F; guy wires 140 in general may provide tension and/or strength to the system 300 in general. Guy wires 140 may be referred to as tension cables. The guy wires 140 may be coupled with at least a portion of the extendible central column 130-*b* and with at least a portion of one or more of the one or more foldable membrane supports 110-*m* and/or 110-*n* of extendible membrane device 125-*c* and/or one or more of the one or more foldable membrane supports 110-*o* and/or 110-*t* of extendible membrane device 125-*d*. System 300 may show guys wires 140 that may generally be in a plane defined by the extendible central column 110-*b* and the unfolded foldable membrane supports 110-*m*, 110-*n*, 110-*o*, and/or 110-*t*. In some embodiments, one or more of the guy wires 140 may be positioned out of plane with respect to a plane defined by the extendible central column 130-*b* and the unfolded foldable membrane supports 110-*m*, 110-*n*, 110-*o*, and/or 110-*t* and/or one or more membranes in an extended state. In some cases, the extendible central column 130-*b* may start to deploy longitudinally, picking up the outboard membrane support 110-*m* and/or 110-*o* and unfolding them via guy wires 140. Guy wires 140 may strengthen the foldable membrane supports 110. While system 300 shows eight guy wires 140, some embodiments may utilize more or less guy wires.

Figure 4A:
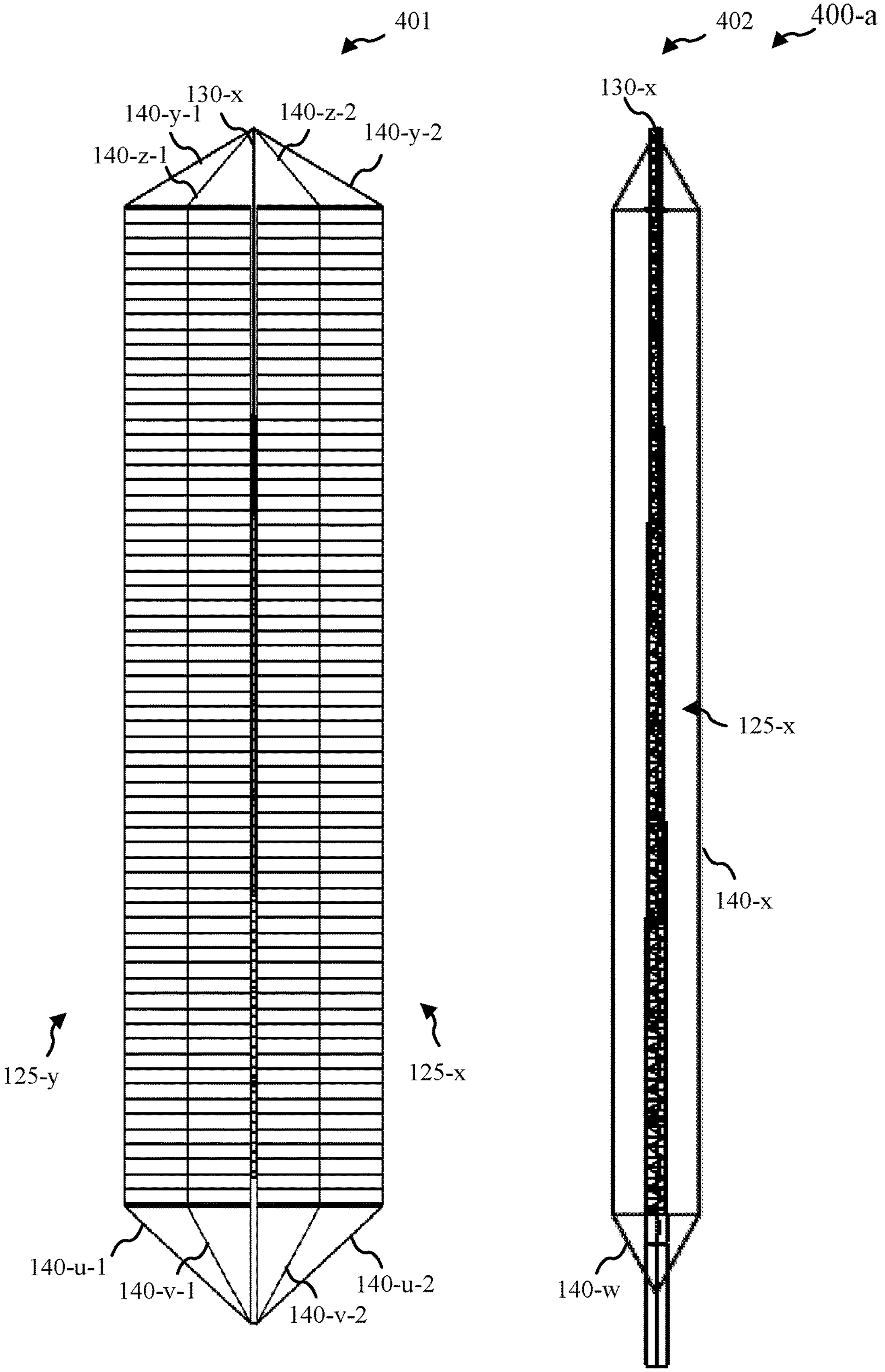
FIGS. 4A and 4B show systems in accordance with various embodiments.
Figure 4B:
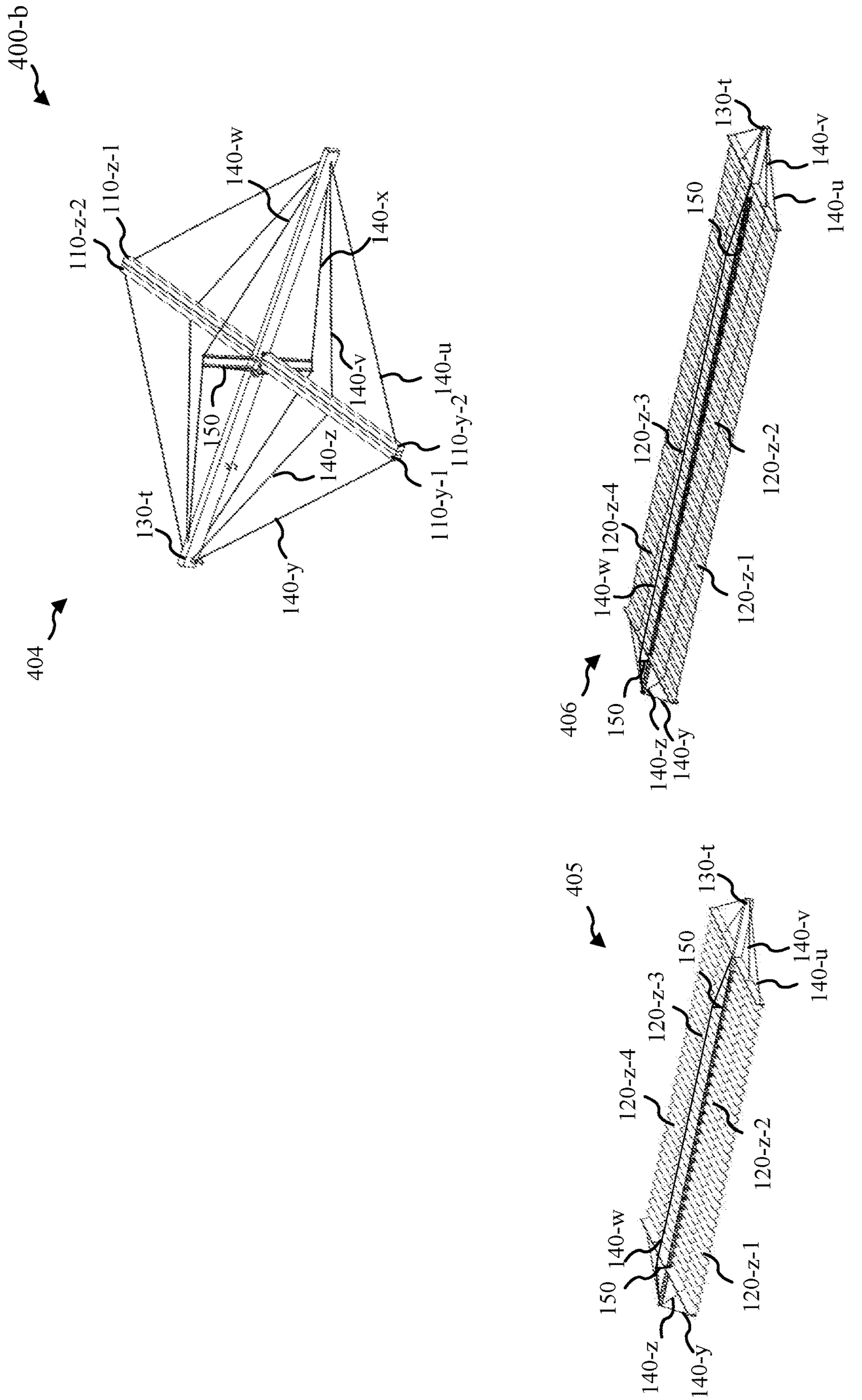

Turning now to FIG. 4A and FIG. 4B, systems 400-*a* and 400-*b* in accordance with various embodiments are provided. Systems 400-*a* and 400-*b* may utilize extendible membrane systems and/or extendible membrane devices as described with respect to FIG. 1, FIGS. 2A-2F, and/or FIG. 3, for example. In these examples, one or more out-of-of plane guy wires (such as guy wires 140-*w* and/or 140-*x*) may be provided; in-plane guy wires 140-*u*-1, 140-*u*-2, 140-*v*-1, 140-*v*-2, 140-*y*-1, 140-*y*-2, 140-*z*-1, and/or 140-*z*-2 may also be provided. FIG. 4A shows system 400-*a* both from a front view 401 and side view 402. The front view may show the in-plane wires 140-*u*-1, 140-*u*-2, 140-*v*-1, 140-*v*-2, 140-*y*-1, 140-*y*-2, 140-*z*-1, and/or 140-*z*-2; front view 401 may also show extendible membrane devices 125-*x* and 125-*y* along with extendible central column 130-*x*. Side view 402 may show the out-of plane wires 140-*w* and/or 140-*x*, along with extendible central column 130-*x* and a side view of extendible membrane devices 125-*x*.

FIG. 4B shows system 400-*b* in various stages of deployment 404, 405, and 406. One or more foldable membrane supports 110-*y*-1, 110-*y*-2, 110-*z*-1, and/or 110-*z*-2 and one or more out-of-plane battens 150 may be deployed. In some cases, the one or more out-of-plane support battens 150 may be utilized to facilitate positioning and/or supporting the out-of-plane guy wires 140-*w*, 140-*x* (see stages 404 and/or 405). At stage 404, the extendible central column 130-*t* may start to be extended, while the one or more guy wires may start to be tensioned utilizing the out-of plane guy wires 140-*w* and/or 140-*x* and/or the in-plane guy wires 140-*u*, 140-*v*, 140-*y*, and/or 140-*z*. At stage 405, the one or more membranes 120-*z*-1, 120-*z*-2, 120-*z*-3, and/or 120-*z*-4 may be extended via the extending extendible central column 130-*t*. At stage 406, the one or more membranes 120-*z*-1, 120-*z*-2, 120-*z*-3, and/or 120-*z*-4 may be further extended via the extending extendible central column 130-*t* and/or tensioning via the guy wires 140.

Figure 5B:
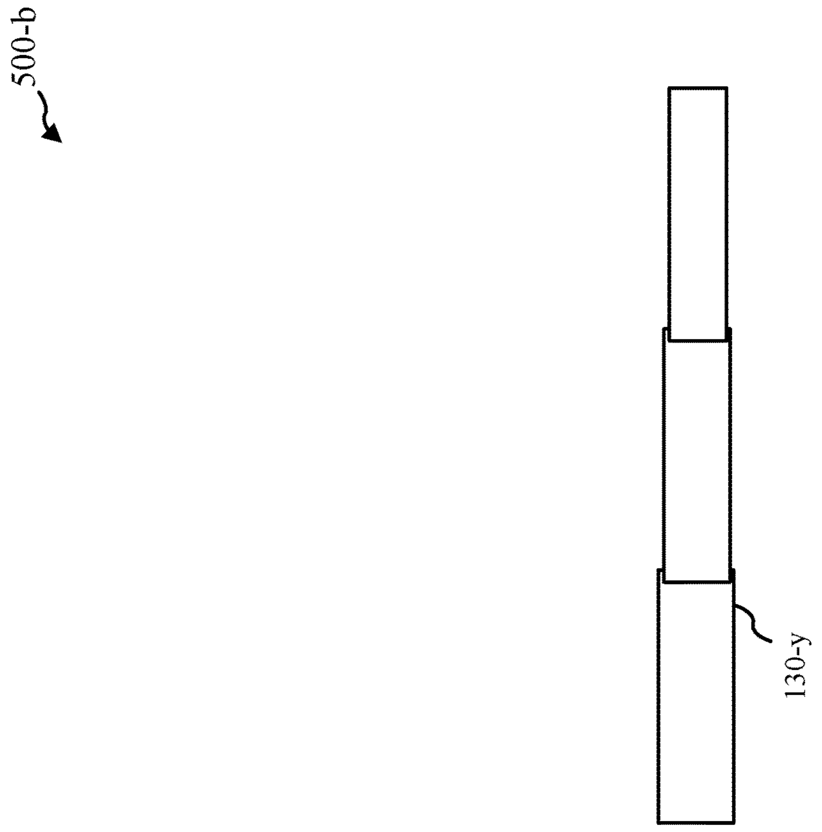
FIGS. 5A, 5B, and 5C show aspects of different systems and/or devices in accordance with various embodiments.
Figure 5A:
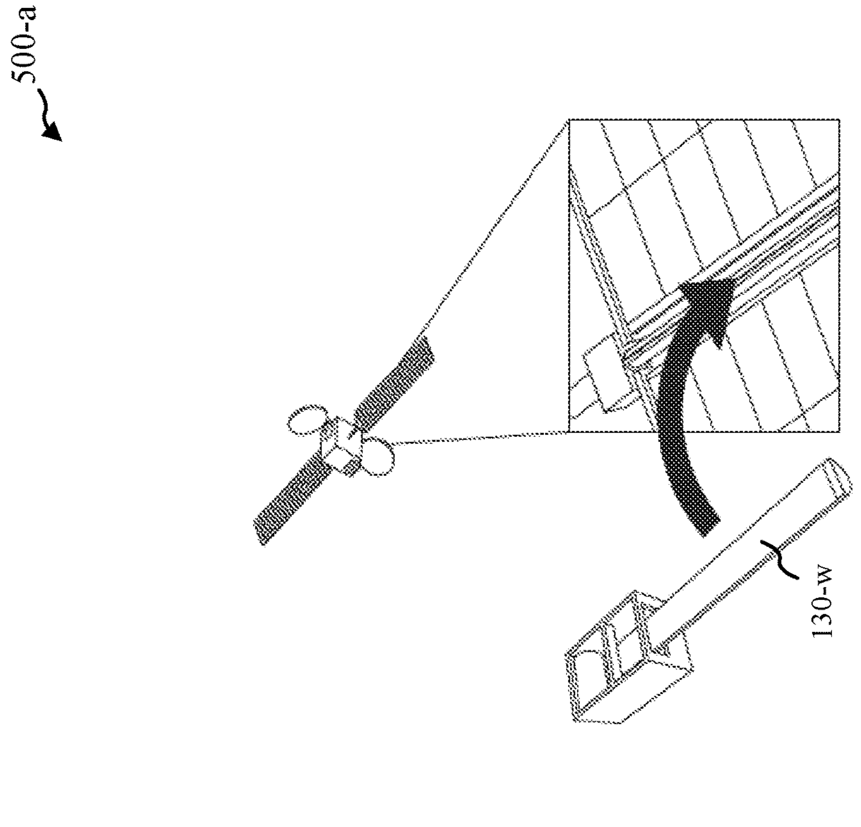
Figure 5C:
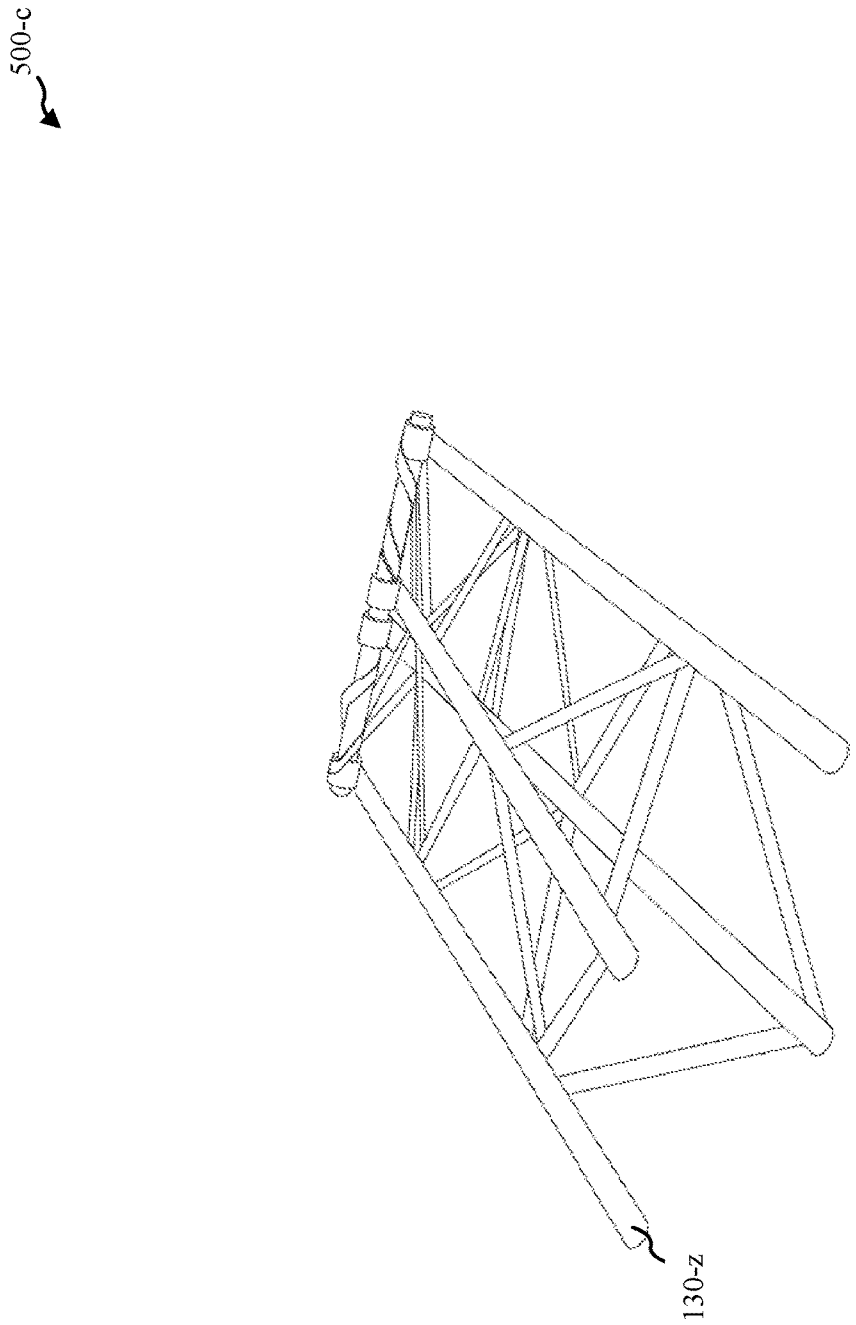

Turning to FIG. 5A, FIG. 5B, and FIG. 5C, systems 500-*a*, 500-*b*, and 500-*c* (in some cases, these may be referred to as devices) are provided in accordance various embodiments. These systems generally show different types of extendible central column structures 130 that may be utilized in different embodiments. Systems 500-*a*, 500-*b*, and/or 500-*c* may be examples of aspects of system 100 of FIG. 1A, system 200 of FIGS. 2A-2F, system 300 of FIG. 3, system 400-*a* of FIG. 4A, and/or system 400-*b* of FIG. 4B. For example, system 500-*a* generally shows an extendible central column 130-*w* with a tubular beam structure that may be utilized in some embodiments; this structure may also be referred to as a split tube structure. System 500-*b* generally shows a telescoping boom 130-*y* that may be utilized as an extendible central column in some embodiments. The extendible central column 130-*y* may include a telescoping truss column in some cases. System 500-*c* generally shows a rollable truss 130-*z* that may be utilized as an extendible central column in some embodiments. Other examples of extendible central columns may include at least a foldable column, a coilable column, or an articulated truss column. The extendible central column may include a lattice structure. In some embodiments, the extendible central column is configured to have a compression load ratio less than or equal to 30%. Lower compression load ratios may be utilized in some cases, such as less than 25%, less than 20%, less than 15%, less than 10%, and/or less than 5%.

Figure 6A:
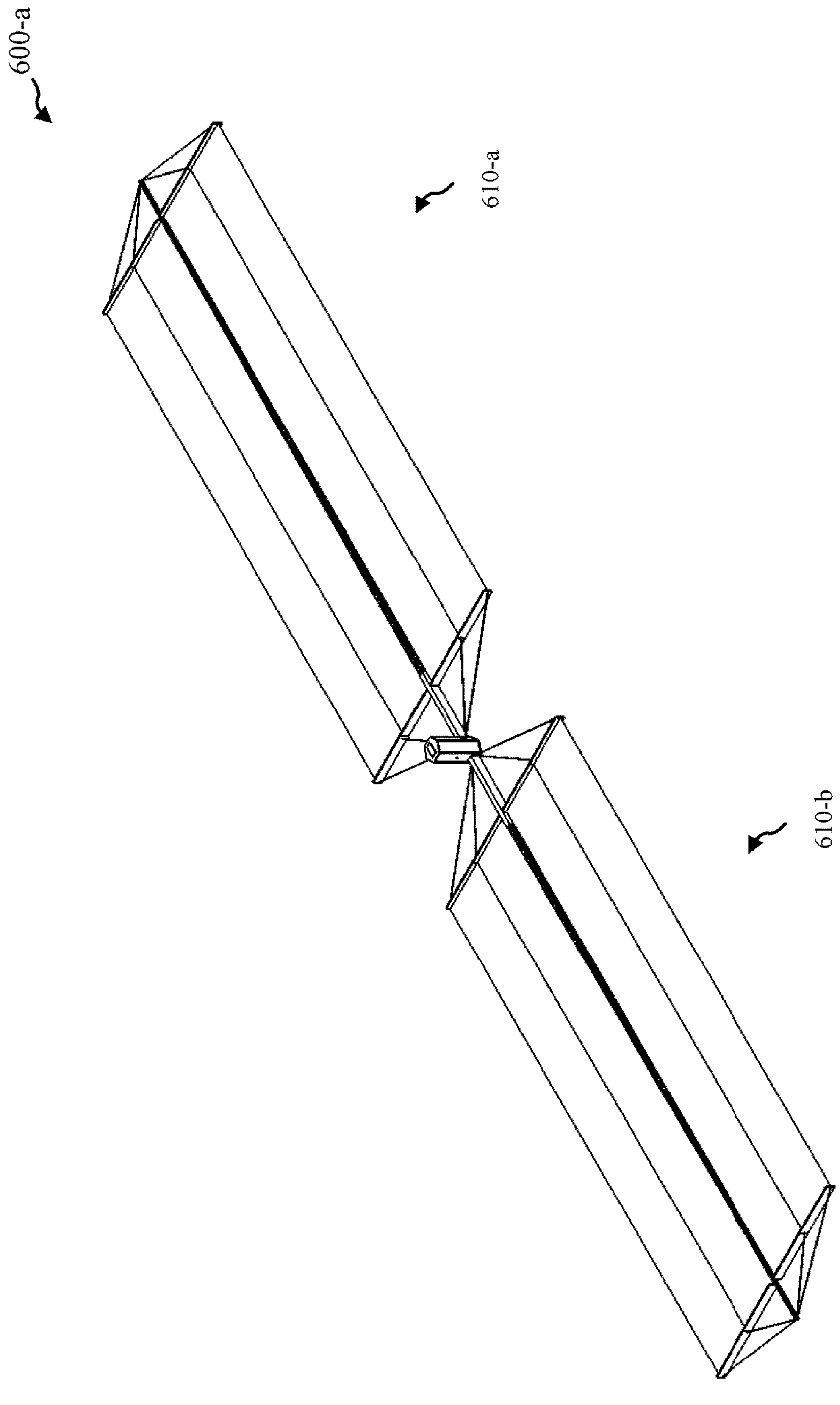
FIGS. 6A, 6B, 6C, and 6D show systems in accordance with various embodiments.
Figure 6B:
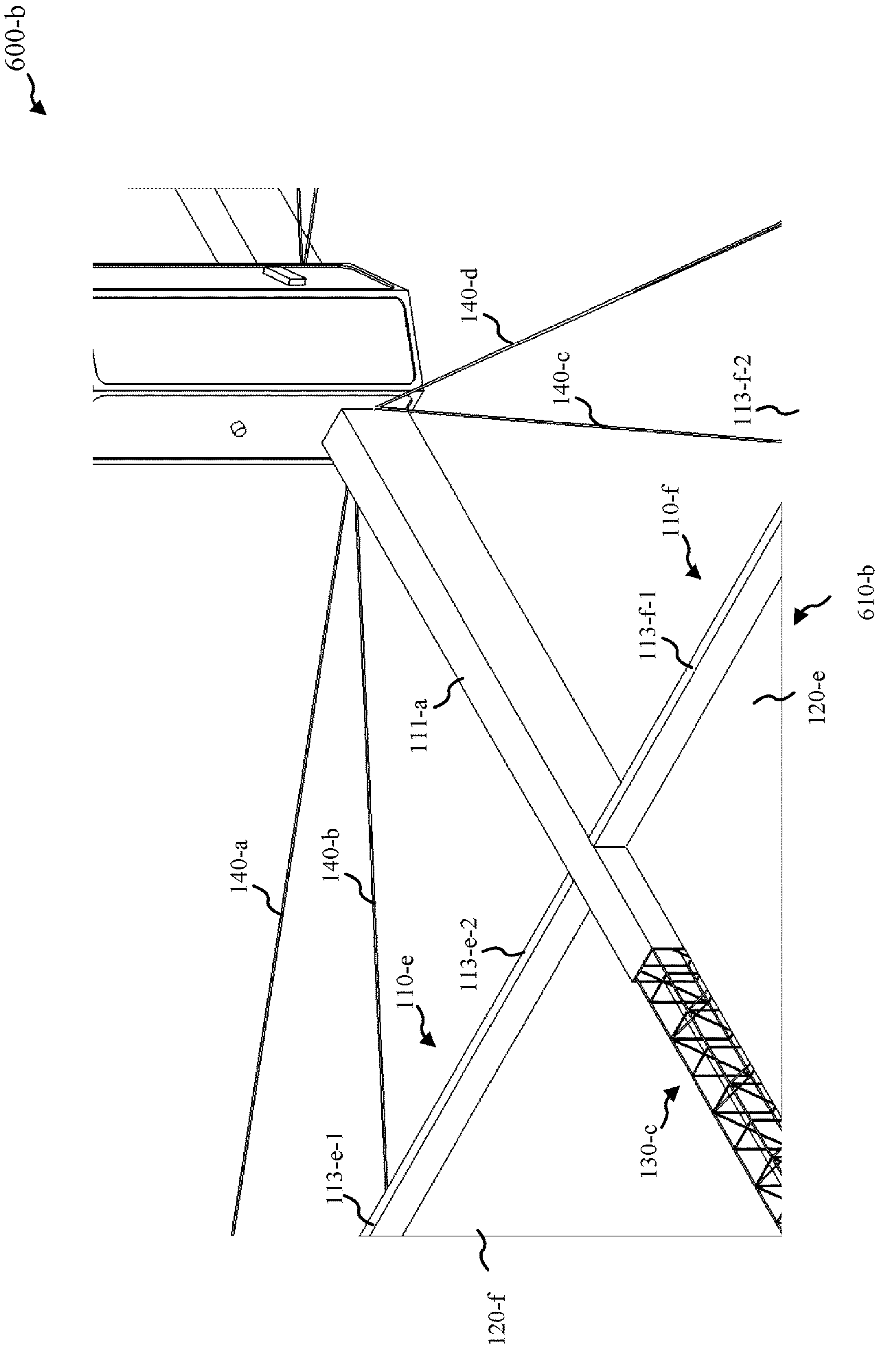
Figure 6C:
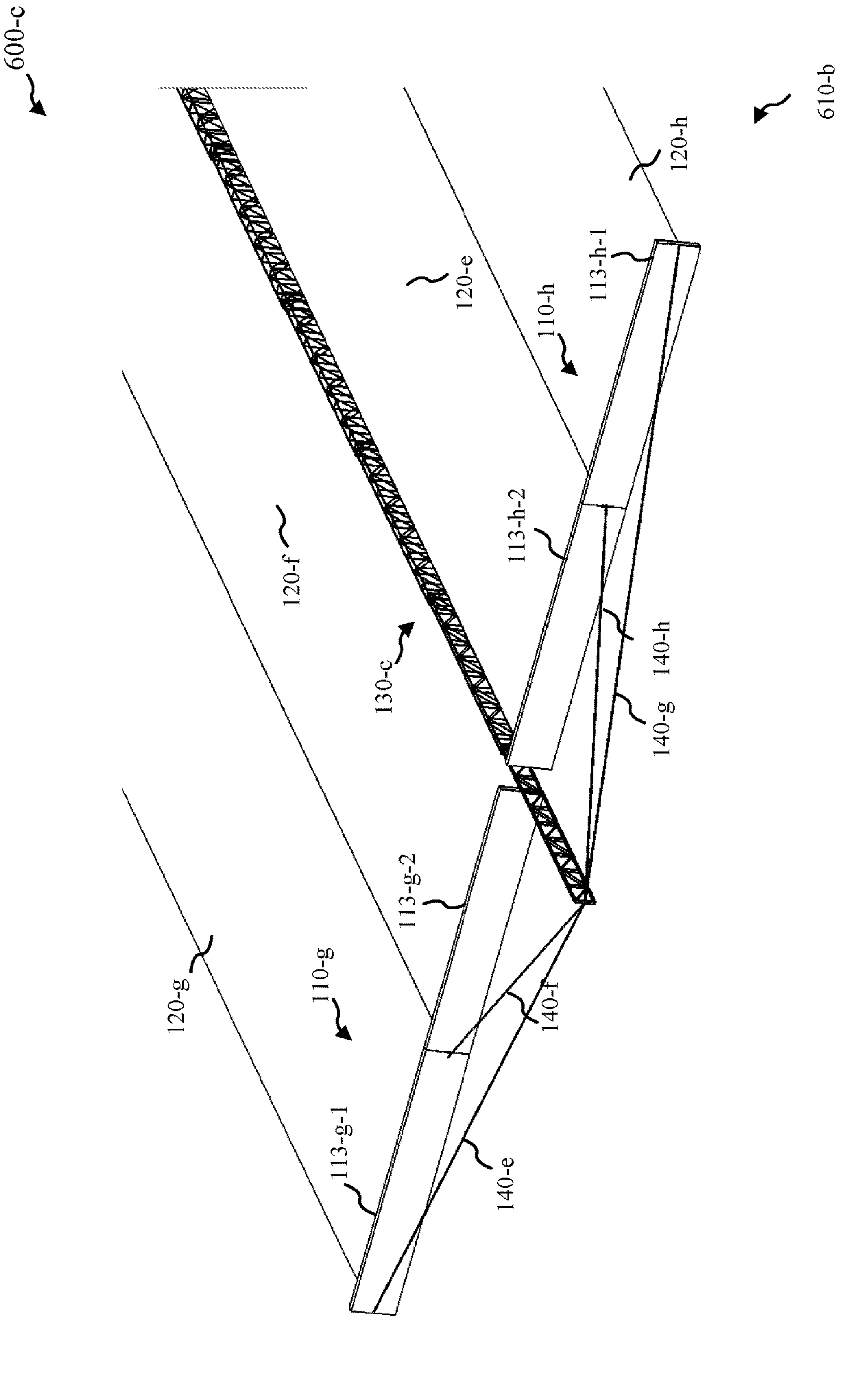

FIG. 6A, FIG. 6B, and FIG. 6C show aspects of a deployed system in accordance with various embodiments. For example, FIG. 6A shows a system 600-*a* with two deployed extendible membrane systems 610-*a* and 610-*b*, which may be examples of system 100 of FIG. 1, system 200 of FIGS. 2A-2F, system 300 of FIG. 3, system 400-*a* of FIG. 4A, system 400-*b* of FIG. 4B. System 600-*a* may utilize aspects of system 500-*a* of FIG. 5A, system 500-*b* of FIG. 5B, and/or system 500-*c* of FIG. 5C in some embodiments. FIG. 6B shows a system 600-*b* that may highlight specific aspects of system 600-*a* of FIG. 6A, specifically aspects of extendible membrane system 610-*b*. This may include a central column launch canister 111-*a*, which may be considered part of the extendible central column 130-*c*. In some embodiments, the extendible central column 130-*c* may be configured as a telescoping truss. Guy wires 140-*a*, 140-*b*, 140-*c*, and 140-*d* may be configured to couple the launch canister 111-*a* with the double-fold spreader bars/foldable membrane supports 110-*e* and 110-*f*. Foldable membrane supports 110-*e* and 110-*f* may include segments 113-*e*-1/113-*e*-2 and 113-*f*-1/113-*f*-2, respectively. Two membranes 120-*e* and 120-*f* may also be shown, though an additional two membranes may be utilized in this configuration as part of extendible membrane system 610-*b*. FIG. 6C shows a system 600-*c* that may highlight specific aspects of system 600-*a* of FIG. 6A, specifically aspects of extendible membrane system 610-*b* with respect to a top portion of the system. This may include extendible central column 130-*c*. In this example, the extendible central column 130-*c* may be configured as a telescoping truss. Guy wires 140-*e*, 140-*f*, 140-*g*, and 140-*h* may be configured to couple a top portion of the extendible central column 130-*c* with the double-fold spreader bars/foldable membrane supports 110-*g* and 110-*h*. The foldable membrane supports 110-*g* and 110-*h* may include segments 113-*g*-1/113-*g*-2 and 113-*h*-1/113-*h*-2, respectively. Two membranes 120-*e* and 120-*f* may also be shown, along with membranes 120-*g* and 120-*h*. These may include photovoltaic arrays or blankets, for example.

Figure 6D:
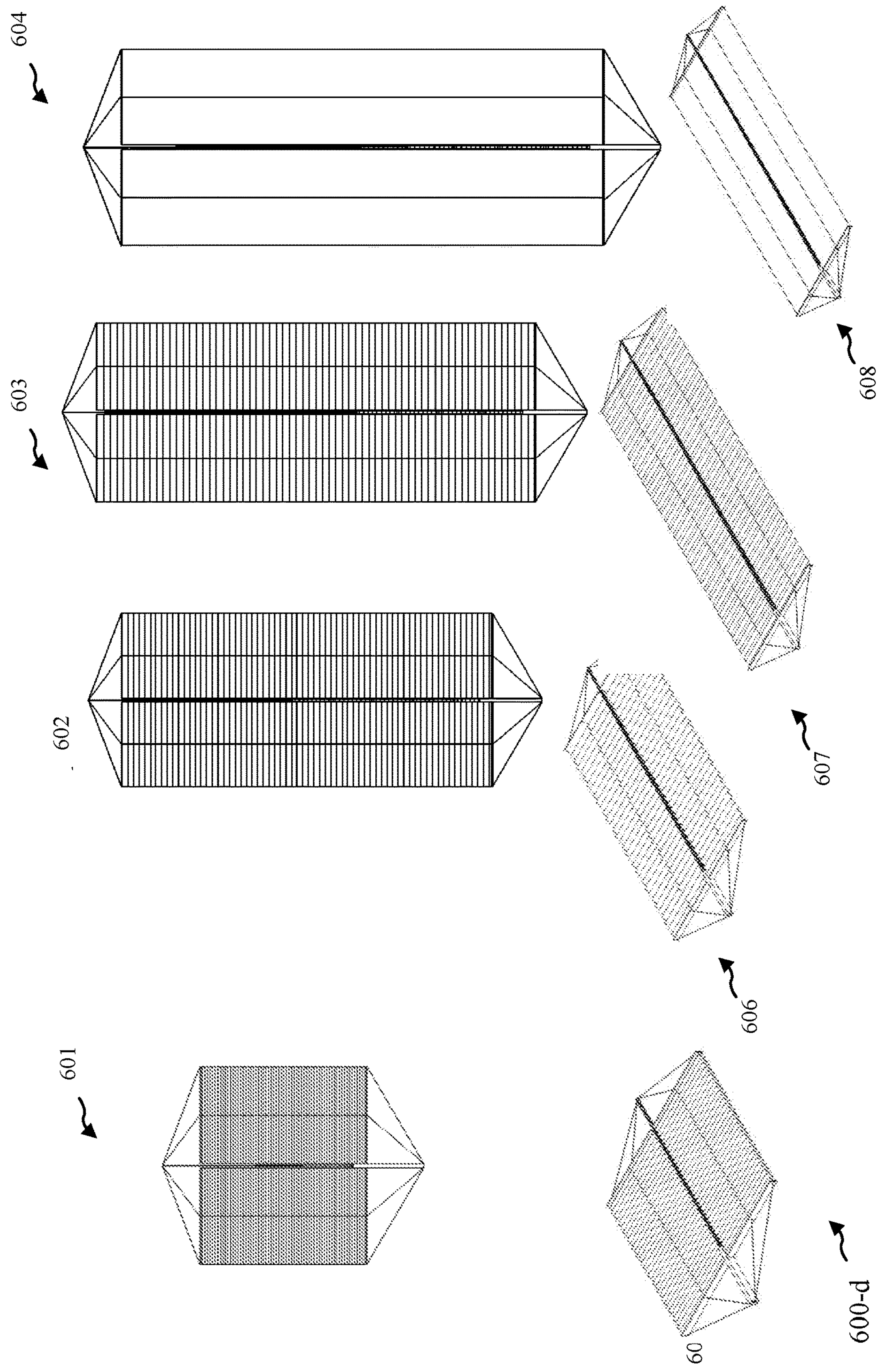

FIG. 6D shows a sequence 600-*d* that may reflect aspects of deployment of an extendible membrane system in accordance with various embodiments. The sequence 600-*d* shows both a face view (601, 602, 603, and 604) and angled side view (605, 606, 607, and 608). The sequence 600-*d* may utilize extendible membrane systems and/or devices such as those in system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, and/or system 500-*c* of FIG. 5C. In particular, sequence 600-*d* may reflect aspects of system 600-*a* of FIG. 6A, system 600-*b* of FIG. 6B, and/or system 600-*c* of FIG. 6C in various stages of deployment. In general, this sequence may reflect a system where the one or more membranes extend in a longitudinal direction as the extendible central column is extended. Typically, at least a portion of each of the one or more membranes may be coupled with a portion of at least one of the one or more foldable membrane supports.

The follow parametric analysis merely provides some additional information regarding some embodiments of different systems, such as those shown with respect to system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 600-*b* of FIG. 6B, system 600-*c* of FIG. 6C, and/or system 600-*d* of FIG. 6D. This analysis may suggest that it may be more desirable to design the ratio of compression load in the central column (and tension in the membranes) to compression strength of boom, q, to be in the range of $0.02<q<0.03$, rather than within the range of $0.2<q<0.3$, for some embodiments. Other embodiments may utilize other values.

The following may generally provide four design cases, which may represent a range of central column architectures and efficiencies; other designs cases may be contemplated within the context of the different embodiments provided. Table 1 below may generally present four design cases considered and resulting trusses that may meet system metrics such as the following: 500 kW of power, with a specific power of 300 $W/m^2$; aspect ratio (l/w) for the system equal 2.5:1; packing efficiency of 50 $kW/m^3$;

deployed stiffness may be 0.1 Hz, and the deployed strength of 0.2 g. Case I may assume a relatively low truss performance index value of μ=200 for the central boom design. This may be representative of a truss of solid rods (e.g. S2 fiberglass based continuous longeron masts or aluminum longeron ISS solar array masts). Case II may assume a higher performance central column truss structural mass performance index value of μ=500, which may be representative of a four longeron truss with pultruded high modulus carbon fiber (e.g. Toray M55J) composite longerons. This may be slightly less than the structural mass performance indices achieved in the GR-1 Sailmast developed by ATK, and the SRTM boom developed by AEC Able, for example. Both SRTM and GR-1 may generally use intermediate modulus pultrude carbon fiber composite longerons. Case III may assume a high performance truss of tubular longerons with a truss performance index value of μ=2000. In this design, the tubular longerons may be assumed to be made of high modulus carbon fiber composite and have a cross sectional radius-to-wall thickness ratio of 25. In each of these first three cases, the "optimum" ratio of compression load in the central boom (and tension in PV blanket) to compression strength of boom, q, may generally be found to be in the range of 0.023<q<0.031. Case IV may be similar to Case II in that a moderately high performance central column truss structural mass performance index value of μ=500 may be assumed, but a more traditional, and higher, blanket tension load (q=0.18) may be generally assumed.

The following may generally found with this analysis. Assumptions on structural mass performance of the central column and spreader bars/foldable membrane supports may generally have a strong impact on system mass. In the low-performance case (Case I), structural mass fraction may be high at 0.611; the mass of the structure may be similar to that of the blankets. Case II may have a much lower structural mass fraction of 0.344, whereas Case III may have a still lower structural mass fraction of 0.104. Indeed, the range of 200<μ<2,000 in structural mass performance may produce a significant variation in total system mass of 2,424 kg, for example.

Furthermore, the central column/truss diameter may be increased substantially in order to achieve higher truss structural mass performance levels. Achieving a high-performance μ=2,000 design may involve a truss that is 2.46 m in diameter, for example, which may be as large as most bus structures and may likely to be too large to easily package. Therefore, this analysis may suggest that a more practical design may include a central column truss structural mass performance index value of μ=500, representative of a four longeron truss, for example, with pultruded high modulus carbon fiber (e.g. Toray M55J) composite longerons—something like the SRTM or the GR-1 Sailmast designs—and may be consistent with achieving a total system structural mass fraction of 0.34.

The 0.2 g acceleration that may generally be involved with these applications may place extremely high strength demands on the central column. While the truss stiffness parameters may be high, they may be only 3 to 7 times higher than SRTM. The strength demands, however, may be approximately 20 to 40 times higher than the strength of SRTM that may result in very stout longerons with short truss bay lengths. The high strength demands may be similar to terrestrial civil structures and hence, these point designs may be similar to civil structures. Longeron slenderness (l/d) ranges may generally be from 18 to 27. These values may be approximately half that of heritage space structures, which typically may have slenderness values in the range of 40 to 100.

While these sensitivity analyses may indicate that more traditional blanket tensions (q=0.18 for Case IV) may not result in significant differences in central column mass, it may be generally believed that a lighter weight system may be represented by the lower blanket tension load assumptions of Case II (q=0.28) when spreader bar loads and design details may be considered.

TABLE 1

| | Case I | Case II | Case III | Case IV |
|---|---|---|---|---|
| System Summary | | | | |
| Structural Mass, kg | 2,620 | 873 | 196 | 926 |
| System Mass, kg | 4,290 | 2,540 | 1,860 | 2,590 |
| Structural Mass Fraction | 0.611 | 0.344 | 0.105 | 0.357 |
| Specific Power, W/kg | 117 | 197 | 268 | 193 |
| Blanket Tension Ratio, v | 1.24 | 1.24 | 1.24 | 4.02 |
| Central Column Load Ratio, q | 0.023 | 0.028 | 0.031 | 0.18 |
| Central Column Truss Summary | | | | |
| Truss Performance Index, μ | 200 | 500 | 2000 | 500 |
| Truss Diameter, d, m | 1.78 | 1.27 | 2.46 | 0.97 |
| Truss Slenderness, l/d | 38.3 | 53.7 | 27.8 | 70.5 |
| Bay Length, L, m | 0.728 | 0.520 | 1.004 | 0.396 |
| Longeron Diameter, D, m | 0.0407 | 0.0213 | 0.0377 | 0.0201 |
| Longeron Slenderness, L/D | 17.9 | 24.3 | 26.6 | 19.7 |
| Bending Stiffness, EI, $Nm^2$ | 122e6 | 98.6e6 | 90.1e6 | 50.7e6 |
| Bending Strength, S, Nm | 2.64e5 | 1.61e5 | 1.23e5 | 1.66e5 |
| Mass Per Length, $M_{boom}/l$, kg/m | 29.5 | 9.60 | 2.10 | 8.50 |

Figure 7A:
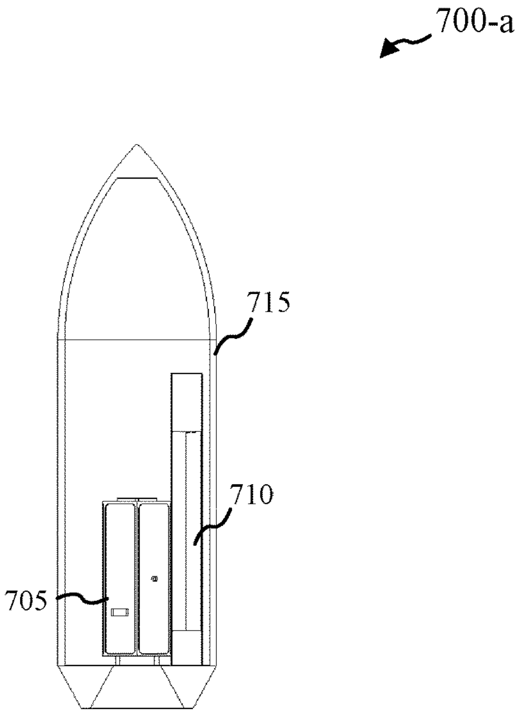
FIGS. 7A, 7B, and 7C show systems in accordance with various embodiments.
Figure 7B:
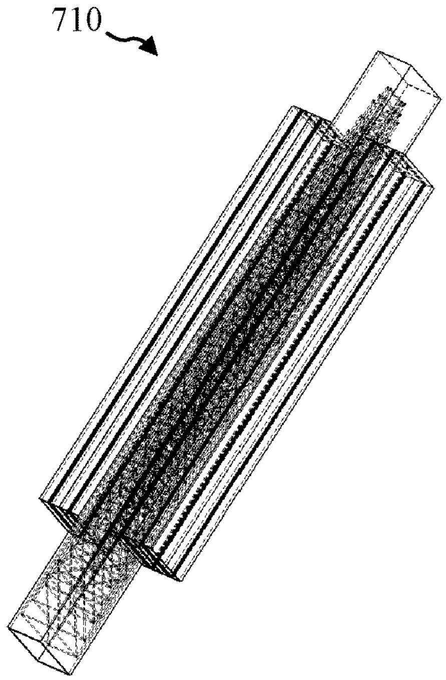
Figure 7C:
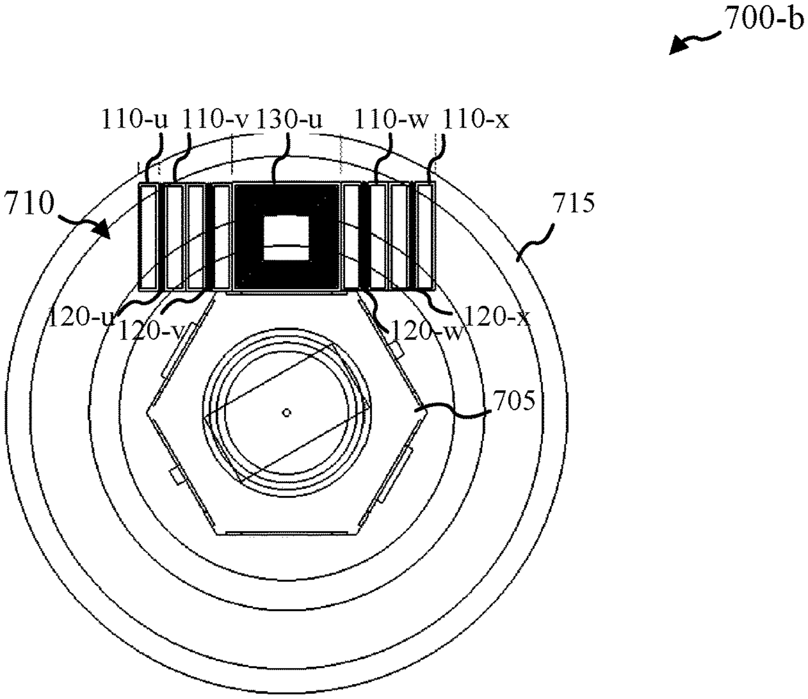

FIG. 7A, FIG. 7B, and FIG. 7C may provide an example of extendible membrane system in accordance with various embodiments packed for launch. FIG. 7A generally shows a side view 700-*a* of launch package, for example. The launch package 700-*a* may include an extendible membrane system 710; FIG. 7B may highlight the extendible membrane system 710 in accordance with various embodiments that may be utilized in this example of a launch package 700-*a*. Extendible membrane system 710 may be an example of aspects of system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG.

6A, system 600-*b* of FIG. 6B, system 600-*c* of FIG. 6C, system 600-*d* of FIG. 6D, and/or system 1100 of FIG. 11A-FIG. 11F. FIG. 7C may show a top down view 700-*b* of the launch package. This example may reflect a 5 m-diameter launch fairing, though other sizes may be utilized. In this example, the packaged volume may be approximately 2 m by 1 m in cross sectional size with a total length of 6.5 m and a total volume of approximately 13 $m^3$. The central truss column (i.e., extendible central column) may be shown in the middle of the package, surrounded by its launch canister. The spreader bars (i.e., foldable membrane supports 110-*u*, 110-*v*, 110-*w*, 110-*x*) and PV blankets (i.e. membranes 120-*u*, 120-*v*, 120-*w*, 120-*x*) may be folded on either side of the central truss column 130-*u* package. For illustrative purposes, the array package may be shown coupled with a hexagonal bus structure 705 roughly 2 m side (from side to side) and 3.5 m in length. The internal diameter of the launch shroud 715 may be shown as 4.75 m. Again, these dimensions are merely for illustration; other embodiments may utilize other dimensions. Similar launch packages and other may be designed for system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, and/or system 1100 of FIG. 11A-FIG. 11F.

Figure 8:
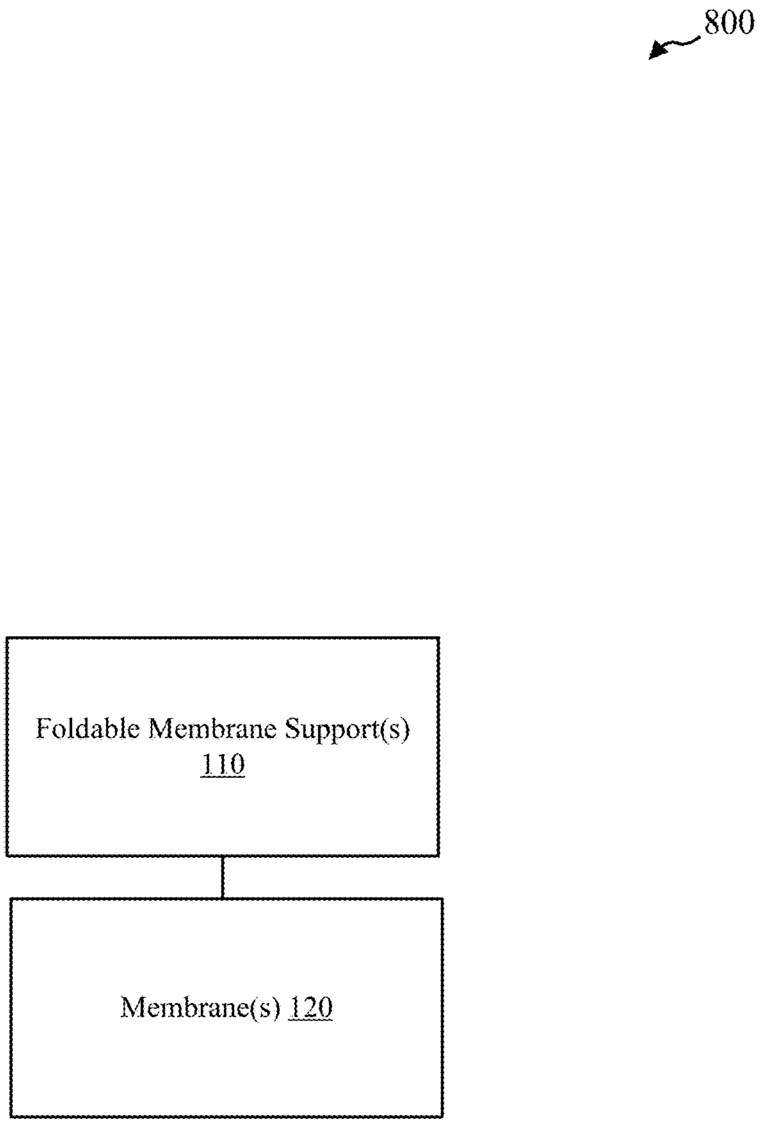
FIG. 8 shows a device in accordance with various embodiments.

Turning now to FIG. 8, an extendible membrane device 800 in accordance with various embodiments is provided. Device 800 may include one or more membranes 120. Device 800 may include one or more foldable membrane supports 110 that may be configured to support the one or more membranes 120. Each of the one or more foldable membrane supports 110 may include two or more segments. The two or more segments from one or more of the one or more foldable membrane supports may be configured to couple with each other utilizing at least a hinge or a latch. Device 800 may be an example of device 125 of FIG. 1. Device 800 may be integrated with different systems such as system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C.

In some embodiments of device 800, the one or more foldable membrane supports 110 include a first foldable membrane support and a second foldable membrane support positioned on opposite ends of a first membrane from the one or more membranes and a second membrane from the one or more membranes 120. The first foldable membrane support may include a first segment and a second segment; the first segment of the first foldable membrane support may be coupled with a first end of the first membrane and the second segment of the first foldable membrane support may be coupled with a first end of the second membrane. The second foldable membrane support may include a first segment and a second segment; the first segment of the second foldable membrane support may be coupled with a second end of the first membrane and the second segment of the second foldable membrane may be coupled with a second end of the second membrane. In some embodiments of device 800, the first foldable membrane support, the second foldable membrane support, the first membrane, and/or the second membrane are configured to store in a sandwiched configuration.

In some embodiments of device 800, each of the one or more foldable membrane supports 110 includes three or more segment. Two or more of the three or more segments may be configured to couple with each other with at least one or more hinges or one or more latches and to store in a z-fold configuration. In some embodiments of device 800, the one or more membranes 120 include one or more photovoltaic arrays. In some embodiments, the length to width ratio of the deployed extendible membrane device 800 is less than or equal to six; in some embodiments, the length to width ratio is less three; some embodiments include a length to width ratio of approximately five.

In some embodiments of the device 800, the one or more foldable membrane supports 110 are configured to couple with an extendible central column. In some embodiments, the one or more foldable membrane supports 110 are configured unfold from at least a V-fold configuration to a linear configuration. In some embodiments, the one or more foldable membrane supports 110 include a first foldable membrane support and a second membrane support; each of the foldable membrane supports 110 may include at least two segments and the first foldable membrane support and the second foldable membrane support may be configured to extend from a first side of an extendible central column. In some embodiments, each of the one or more foldable membrane supports 110 includes two or more segments of each of the one or more foldable membrane supports 110 are configured as at least V-fold configurations. In some embodiments, each of the V-fold configurations is configured at least to stow on a respective side of an extendible central column or to extend from the respective side of the extendible central column. In some embodiments, the two or more segments of each of the one or more foldable membrane supports 110 are configured to deploy from a folded configuration to a linear configuration; each linear configuration may be configured to extend in a respective direction perpendicular to an extendible central column. In some embodiments, each of the one or more foldable membrane supports 110 includes a first segment and a second segment; a first end portion of the first segment of a respective foldable membrane support 110 may be configured to coupled with an extendible central column; a second end portion of the first segment of the respective foldable membrane support 110 may be coupled with a first end portion of the second segment of the respective foldable membrane support 110. In some embodiments, each of the one or more foldable membrane supports 110 is configured to unfold and extend in a respective linear direction perpendicular to an extendible central column.

Turning now to FIG. 9A, FIG. 9B, FIG. 9C, FIG. 9D, FIG. 9E and FIG. 9F, extendible membrane devices 900-*a* and 900-*d* provided in accordance with various embodiments. Devices 900-*a* and 900-*d* may be examples of device 125 of FIG. 1 and/or device 800 of FIG. 8. Devices 900-*a* and/or 900-*d* may be utilized as aspects of system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C, for example.

Figure 9B:
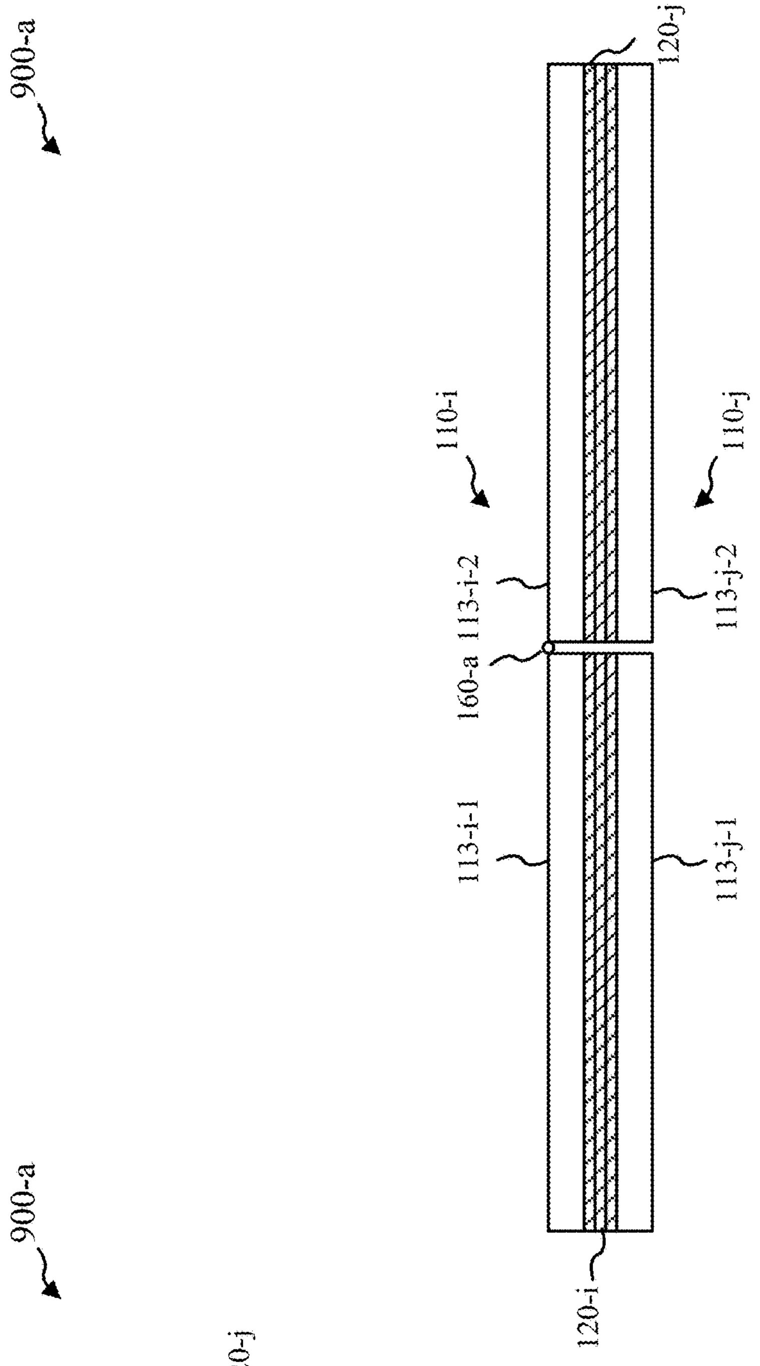
FIGS. 9A, 9B, 9C, 9D, 9E, and 9F show devices in accordance with various embodiments.
Figure 9A:
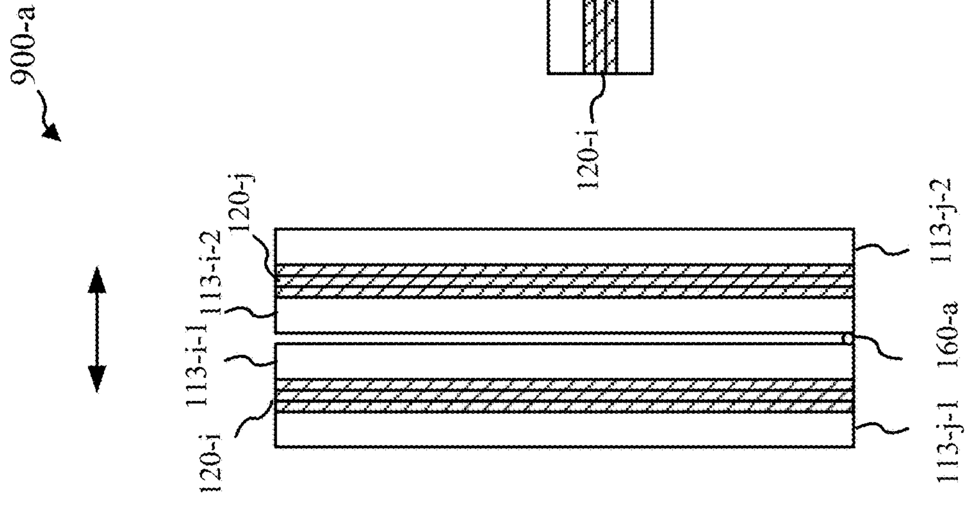
Figure 9C:
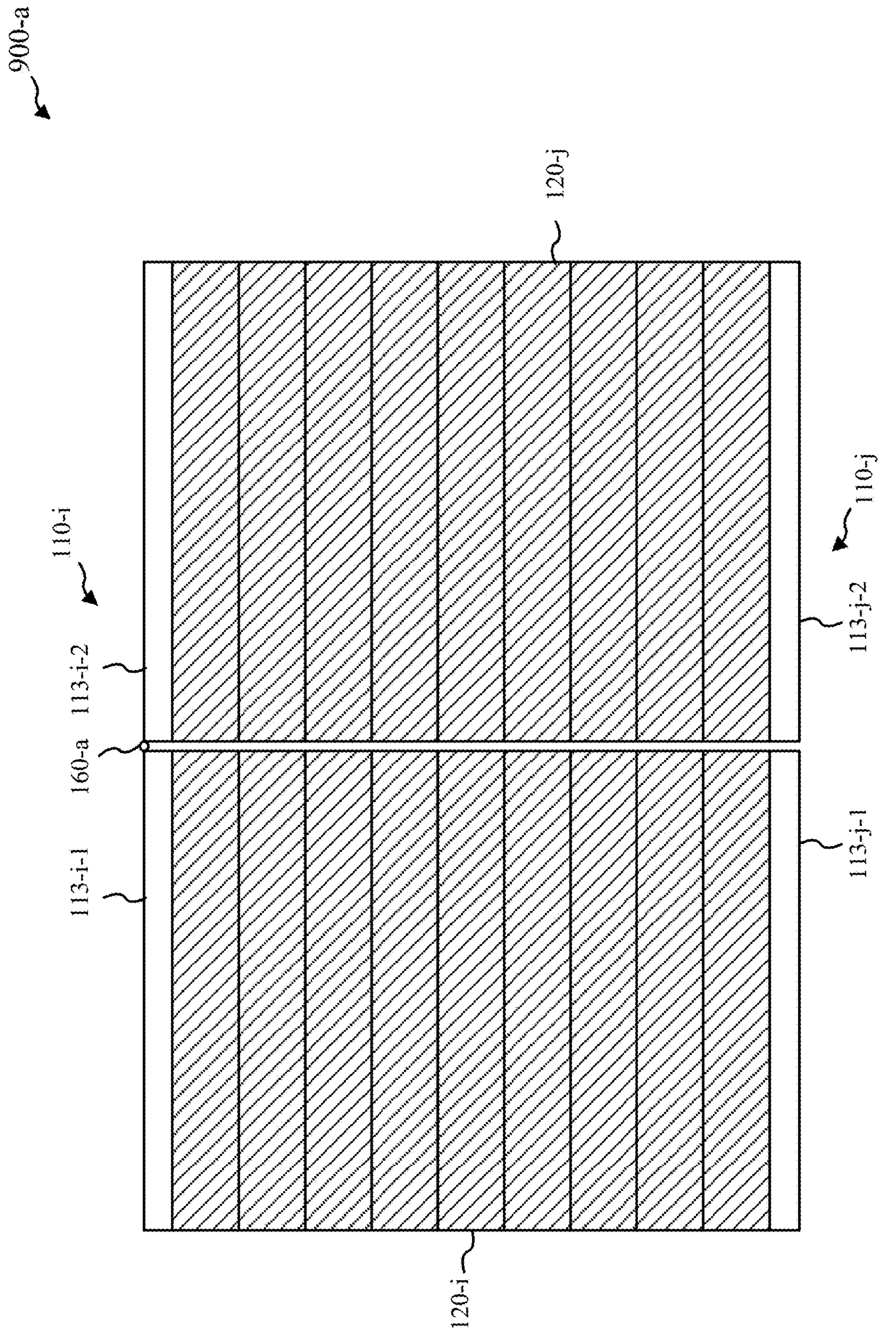
Figure 9E:
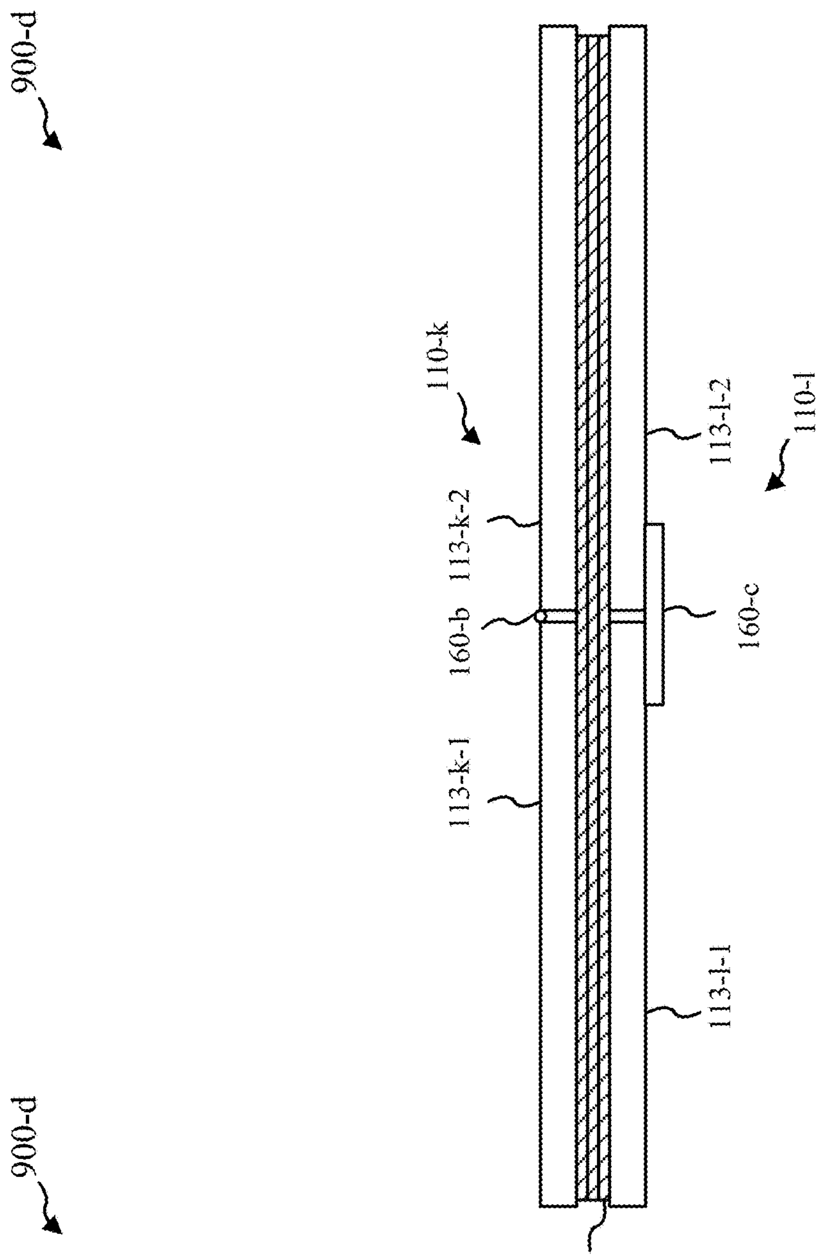
Figure 9D:
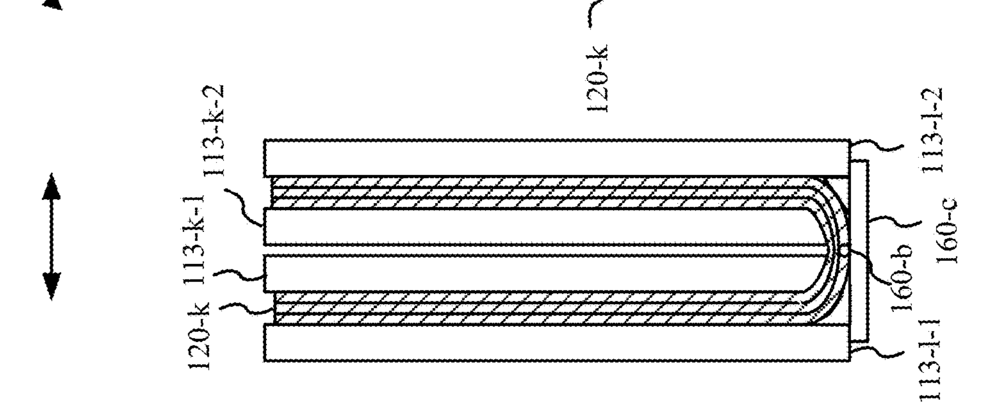
Figure 9F:
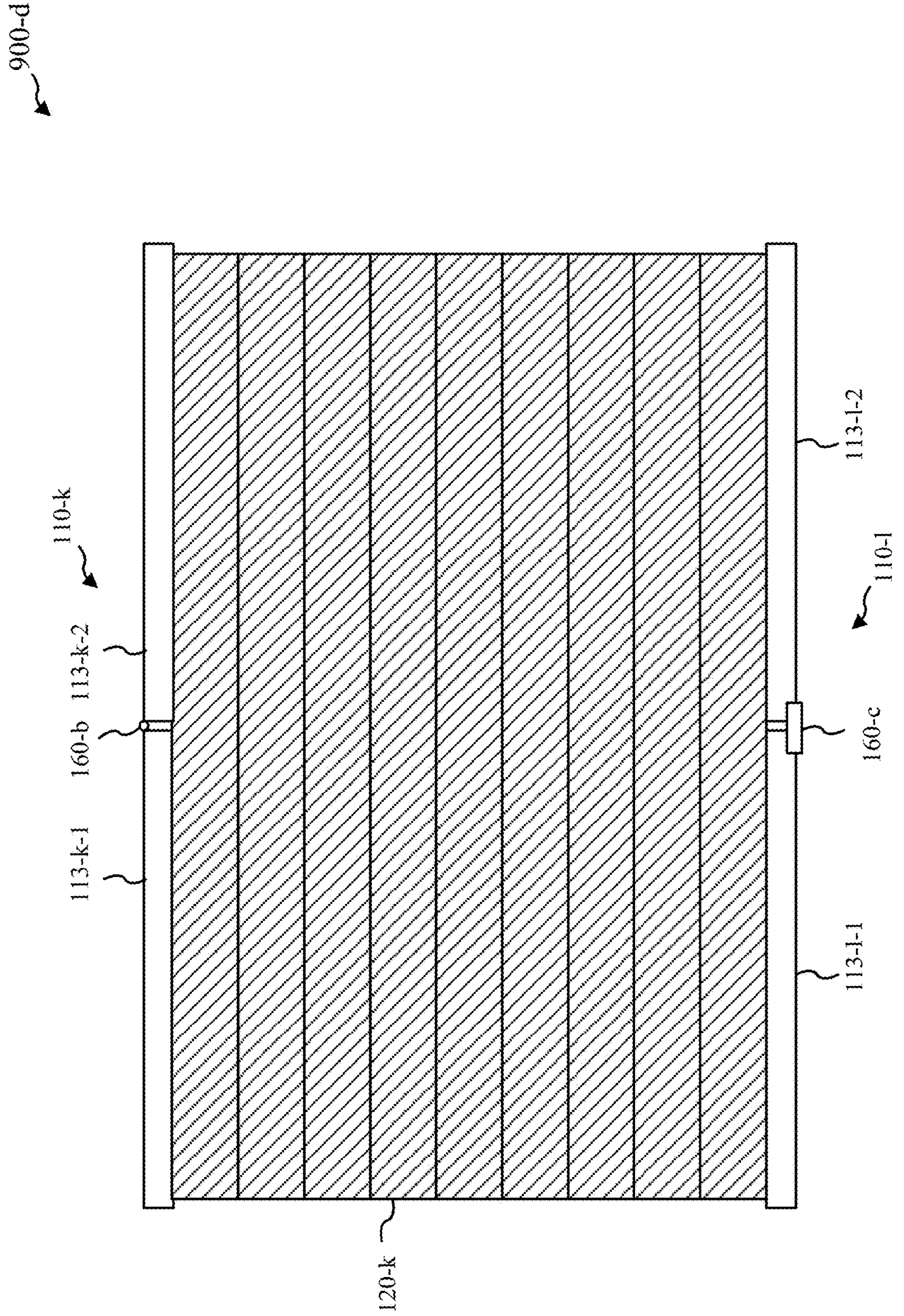

Device 900-*a*, shown in FIG. 9A, FIG. 9B, and FIG. 9C in various stages of deployment, may provide an example of a double-foldable extendible membrane device that may include two membranes 120-*i* and 120-*j*, while device 900-*d*, shown in FIG. 9D, FIG. 9E, and FIG. 9F, may provide a double foldable membrane device that may utilize one membrane 120-*k*, where the membrane 120-*k* may fold in half along a transverse direction; membranes 120-*i*, 120-*j*, and/or 120-*k* may also be folded in an accordion fashion with respect foldable membranes supports 110-*i* and 110-*j* (of device 900-*a*) or 110-*k*, 110-*l* (of device 900-*d*). In some cases, the membranes 120-*i*, 120-*j*, and 120-*k* may be configured to be rolled up.

Each of the one or more foldable membrane supports 110-*i*, 110-*j*, 110-*k*, and/or 110-*l* may include two or more segments. For example, support 110-*i* may include segments 113-*i*-1 and 113-*i*-2, support 110-*j* may include segments 113-*j*-1 and 113-*j*-2, support 110-*k* may include segments 113-*k*-1 and 113-*k*-2, and support 110-*l* may include segments 113-*l*-1 and 113-*l*-2. In some embodiments, these segments may be configured to couple with each other utilizing at least a hinge or a latch (such as hinge/latch 160-*a* of device 900-*a*, or hinges/latches 160-*b*, 160-*c* of device 900-*d*). The hinges/latches 160 may facilitate deployment and/or stabilization of devices 900-*a* and/or 900-*d*. Other coupling and/or folding devices may be utilized besides hinges and/or latches in some embodiments. Additional hinges and/or latches may be utilizes, though not necessarily shown. For example, a latch such as latch 160-*c* may be utilized for device 900-*a* to couple segments 113-*j*-1 and 113-*j*-2 of support 110-*j* with each other.

FIG. 9A, FIG. 9B, and FIG. 9C show device 900-*a* starting in a folded or stored configuration, being extended into a linear configuration, and then being further deployed with respect to the membranes 120-*i*, 120-*j*, where the one or more membranes are unfolded or unrolled between respective segments of the unfolded foldable membranes supports. FIG. 9D, FIG. 9E, and FIG. 9F show a similar sequence.

In some embodiments of device 900-*a*, for example, foldable membrane support 110-*i* and foldable membrane support 110-*j* may be positioned on opposite ends of membrane 120-*i* and membrane 120-*j*. Foldable membrane support 110-*i* may include a first segment 113-*i*-1 and a second segment 113-*i*-2; the first segment 113-*i*-1 of the foldable membrane support 110-*i* may be coupled with a first end of the membrane 120-*i* and the second segment 113-*i*-2 of the foldable membrane support 120-*i* may be coupled with a first end of the membrane 120-*j*. The foldable membrane support 110-*j* may include a first segment 113-*j*-1 and a second segment 113-*j*-2; the first segment 113-*j*-1 of the foldable membrane support 110-*j* may be coupled with a second end of the membrane 120-*i* and the second segment 113-*j*-2 of the foldable membrane support 110-*j* may be coupled with a second end of the membrane 120-*j*.

In some embodiments of the devices 900-*a* and/or 900-*d*, the one or more foldable membrane supports 110-*i*, 110-*j*, 110-*k*, and/or 110-1 are configured to couple with an extendible central column (see FIGS. 11A-11F, for example). In some embodiments, the one or more foldable membrane supports 110-*i*, 110-*j*, 110-*k*, and/or 110-*k* are generally configured to unfold from at least a V-fold configuration to a linear configuration.

Figure 10A:
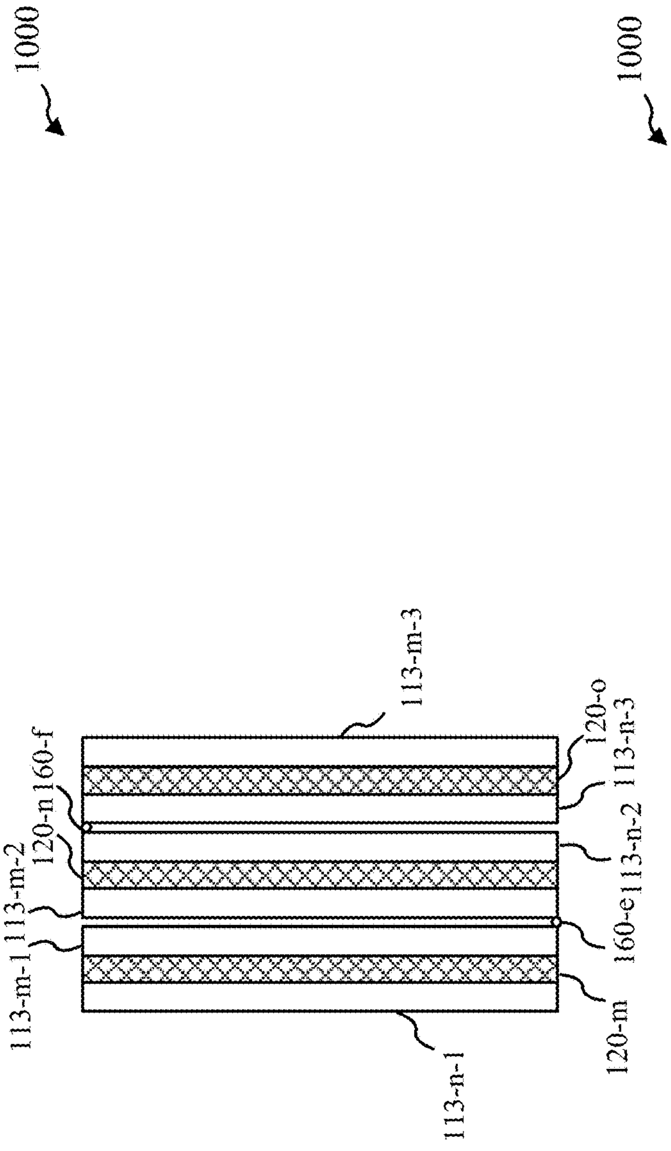
FIGS. 10A, 10B, and 10C show devices in accordance with various embodiments.
Figure 10B:
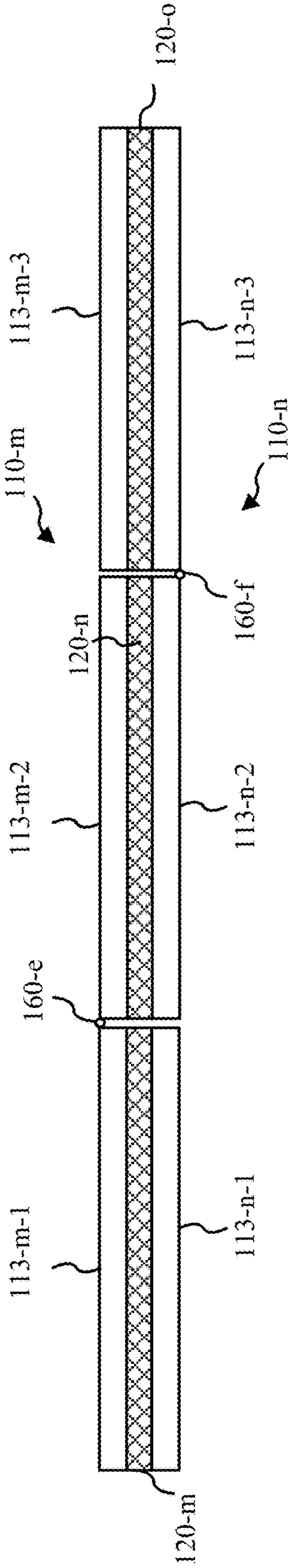
Figure 10C:
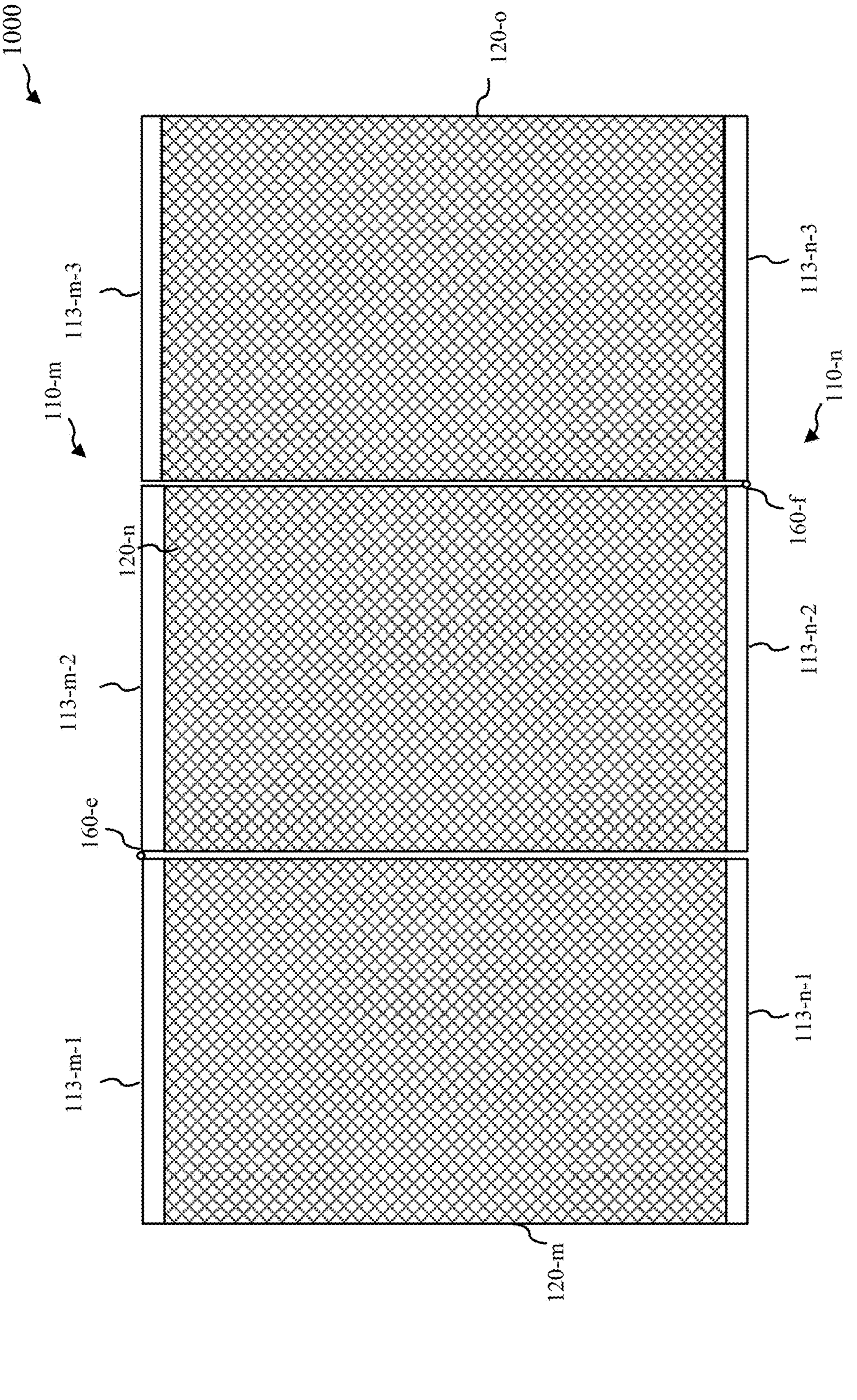

Turning now to FIG. 10A, FIG. 10B, and FIG. 10C, an extendible membrane device 1000 is provided in accordance with various embodiments. Device 1000 may be an example of device 125 of FIG. 1 and/or device 800 of FIG. 8. Device 1000 may be utilized as aspects of system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C. Device 1000 may provide an example of a triple-foldable or Z-fold extendible membrane device that may include three membranes 120-*m*, 120-*n*, and 120-*o*, though some embodiments may utilize a single membrane that may be configured to fold in a z-configuration in place of the three shown membranes. In a stored or undeployed configuration, membranes 120-*m*, 120-*n*, and 120-*o* may be rolled up with between respect foldable membranes supports 110-*m* and 110-*n*. In some embodiments, the membranes 120-*m* and 120-*n*, and 120-*o* may be configured to fold into an accordion configuration.

Each of the one or more foldable membrane supports 110-*m* and 110-*n* may include three or more segments. For example, support 110-*m* may include segments 113-*m*-1, 113-*m*-2, and 113-*m*-3; support 110-*n* may include segments 113-*n*-1, 113-*n*-2, and 113-*n*-2. Tow or more of the segments 113-*n* (and/or segments 113-*m*) may be configured to couple with each other utilizing at least a hinge or a latch. For example, segments 1130-*n*-2 and 113-*n*-3 may be coupled with hinge/latch 160-*f*; segments 113-*m*-1 and 113-*m*-2 may be coupled with hinge/latch 160-*g* (while these figures may show two such elements, additional elements may be utilized in some embodiments). The hinges/latches 160 may facilitate deployment and/or stabilization of device 1000. Other coupling and/or folding devices may be utilized besides hinges and latches in some embodiments. Additional hinges and/or latches may be utilizes, though not necessarily shown. For example, a latch such as latch 160-*c* (see FIG. 9D) may be utilized for device 1000 to couple segment 113-*n*-1 with segment 113-*n*-2 and/or to couple segment 113-*m*-2 with 113-*m*-3.

FIG. 10A, FIG. 10B, and FIG. 10C generally show device 1000 starting in a folded or stored configuration, being extended into a linear configuration, and then being further deployed with respect to the membranes 120-*m*, 120-*n*, and 120-*o*, where the one or more membranes are unrolled (or unfolded) between respective segments of the unfolded foldable membranes supports.

In general, for device 1000, each of the one or more foldable membrane supports 110 may include three or more segments. Two or more of the segments may be configured to couple with each other with at least one or more hinges or one or more latches and to store in a z-fold configuration. In some embodiments of device 1000, the one or more of the membranes 120 may include one or more photovoltaic arrays, blankets, or solar cells. In some embodiments, the length to width ratio of the deployed extendible membrane device 1000 is less than or equal to six, with one embodiment having a length to width ratio of approximately five. Some embodiments may utilize a length to ratio of less than or equal to three.

Turning now to FIG. 11A, FIG. 11B, FIG. 11C, FIG. 11D, FIG. 11E, and FIG. 11F, a system in accordance with various embodiments is provided. The system may be reflected in these figures as a sequence (1100-*a*, 1100-*b*, 1100-*c*, 1100-*d*, 1100-*e*, and/or 1100-*f*) of deployment stages of the system in general. The system may be an example of system 100 of FIG. 1. Aspects of FIGS. 11A, 11B, and 11C may be similar to those shown in FIGS. 2A, 2B, and 2D, respectively.

Figure 11A:
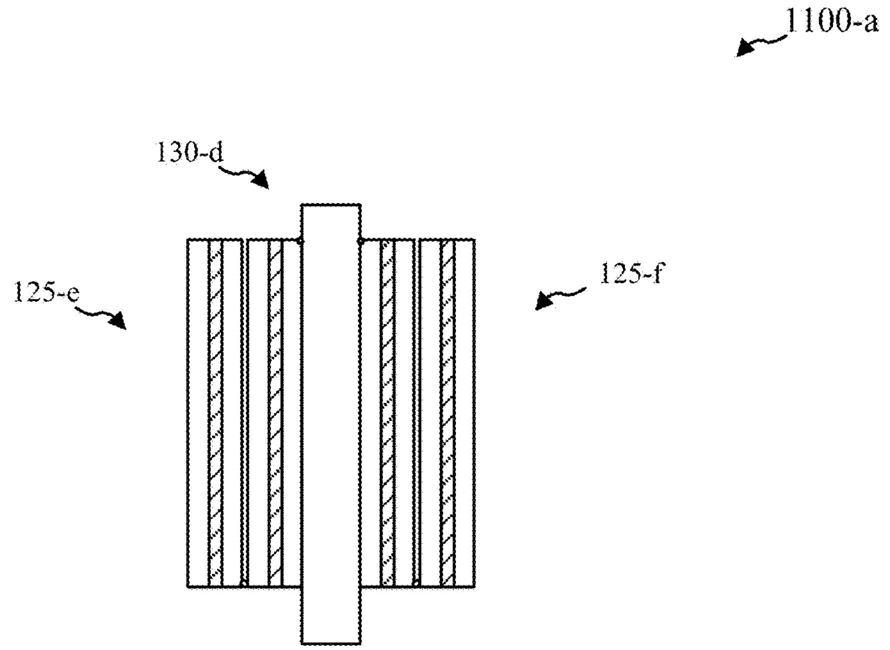
FIGS. 11A, 11B, 11C, 11D, 11E, and 11F show systems in accordance with various embodiments.

In FIG. 11A, the system as shown as system 1100-*a* may reflect the system in a stowed configuration. Two extendible membrane devices 125-*e*, 125-*f* are generally shown; each may utilize double-folded membrane supports; each foldable membrane support may include two or more segments. Each respective foldable membrane support may be associated with a respective membrane. Subsequence figures may identify these specific elements in more detail. System 1100-*a* may include an extendible central column 130-*d*. In some cases, the portion of the column 110-*d* shown in FIG. 11A may be referred to as a canister; the canister may be configured as an outer housing or casing for an extendible central column 130-*d*; the canister may be considered as part of the extendible central column 130-*d*. The foldable membrane supports may be referred to as double-folded spreader bars in some cases. Some embodiments may include additional folded segments, such as a triple-folded spreader bar (e.g., Z-fold configuration) or quadruple-folded spreader bar (e.g., W-fold configuration).

Figure 11B:
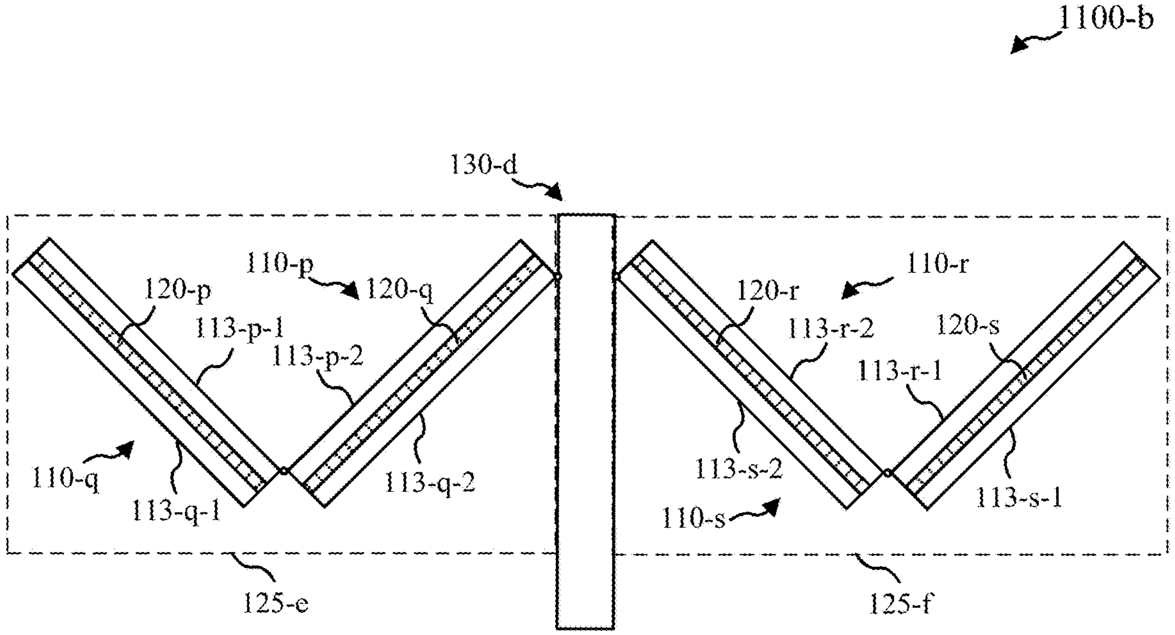
Figure 11C:
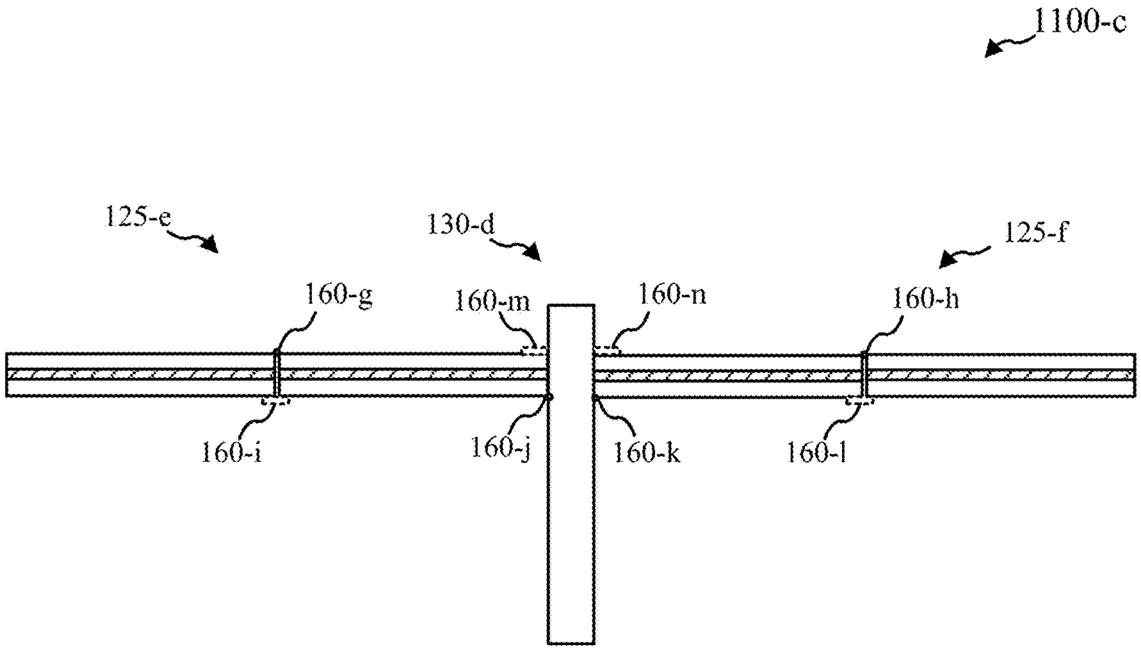

In FIG. 11B, foldable membrane supports, or double-folded spreader bars, (shown as 110-*p*, 110-*q* for device 125-*e*; 110-*r*, 110-*s* for device 125-*f*) may be released from tie-down fixtures that hold them to the portion of the extendible central column canister 130-*d* and unfolded laterally. FIG. 11B also shows membranes 120-*p*, 120-*q*, 120-*r*, and 120-*s* in a stored state between respective membrane supports 110. Each of the foldable membrane supports 110-*p* and 110-*q* may include two segments 113-*p*-1/113-*p*-2 and 113-*q*-1/113-*q*-2, respectively (similarly for supports 110-*r* and 110-*s* with segments 113-*r*-1/113-*r*-2 and 113-*s*-1/113-*s*-2, respectively). FIG. 11C shows the system 1100-*c* at the point where there may be full transverse extension of the extendible membrane devices 125-*e* and 125-*f* from a folded configuration to a linear configuration. One or more hinges and/or latches 160-*g*, 160-*h*, 160-*i*, 160-*j*, 160-*k*, 160-*l*, 160-*m*, and/or 160-*n* may be utilized to facilitate the deployment from the folded configuration to the linear configuration. Some embodiments may utilize guy wires to facilitate deployment.

Figure 11D:
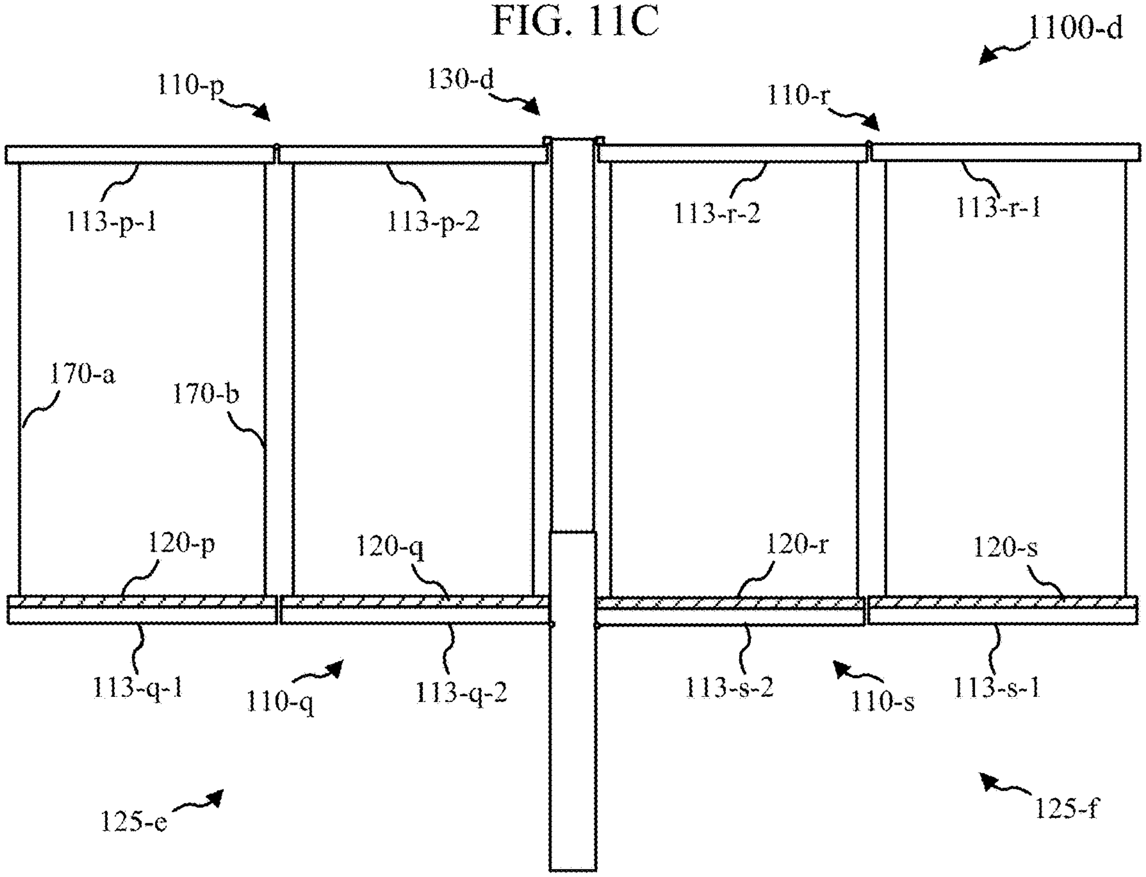
Figure 11E:
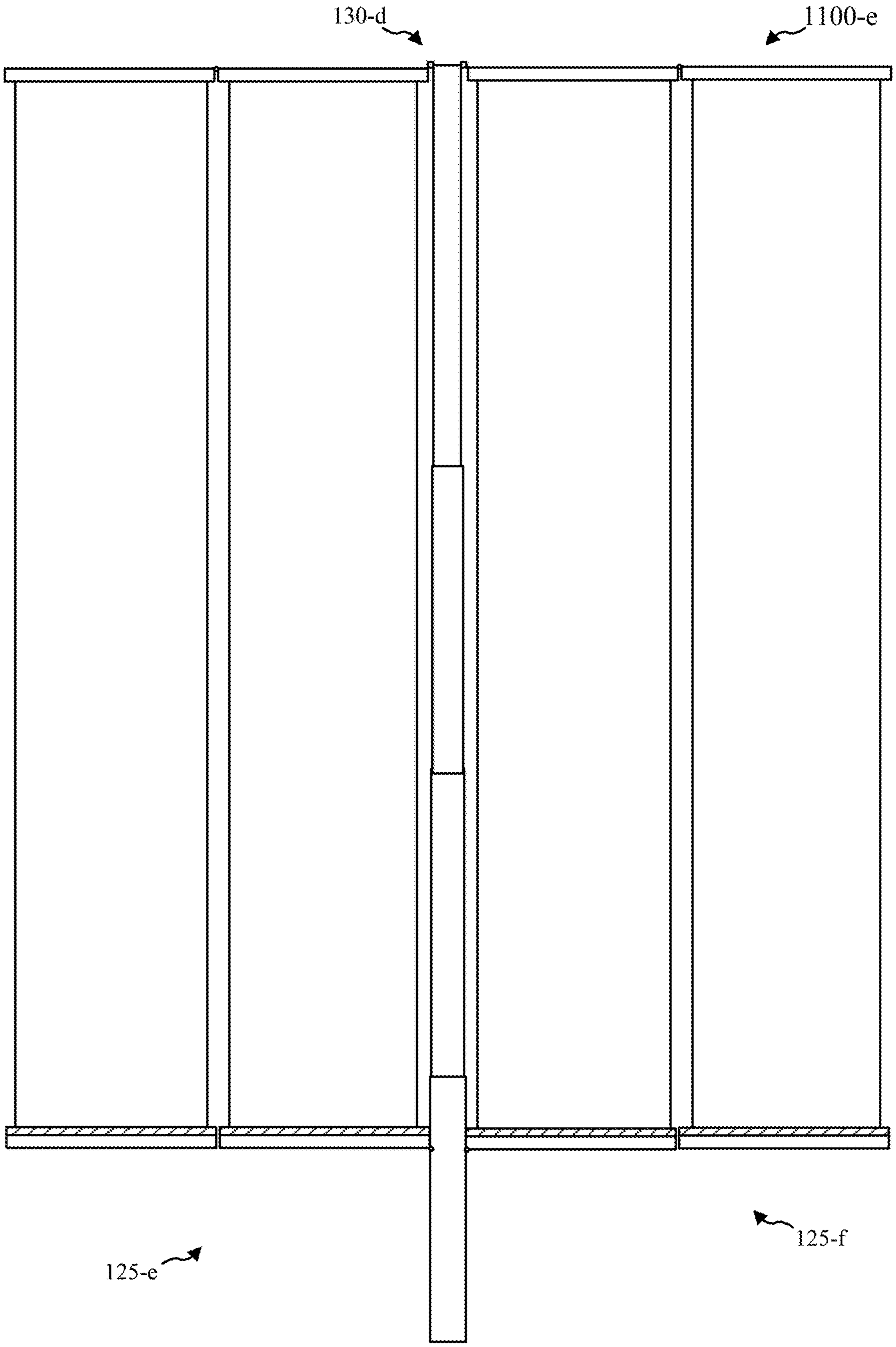

FIG. 11D goes on to show the extension of extendible central column 130-*d*. One may note that in this configuration, membranes 120-*p*, 120-*q*, 120-*r*, and 120-*s* may not extend with the extension of extendible central column 130-*d*. The extendible central column may include telescoping design, though other designs may be utilized. Merely by way of example, a telescoping deployment architecture may be useful when a collapse to roughly one tenth of its deployed length may be utilized. Membrane support elements 170-*a*, 170-*b* may be utilized to facilitate the deployment of components such as membrane 120-*p* as will be shown in FIG. 11F. Similar elements may be show with respect to the other membranes, but not specifically called out. These membrane support elements may include different wires, for example. FIG. 11E shows the system 1100-*e* in a further extended state with respect to the extendible central column 130-*d*, though the membranes have yet to be extended.

Figure 11F:
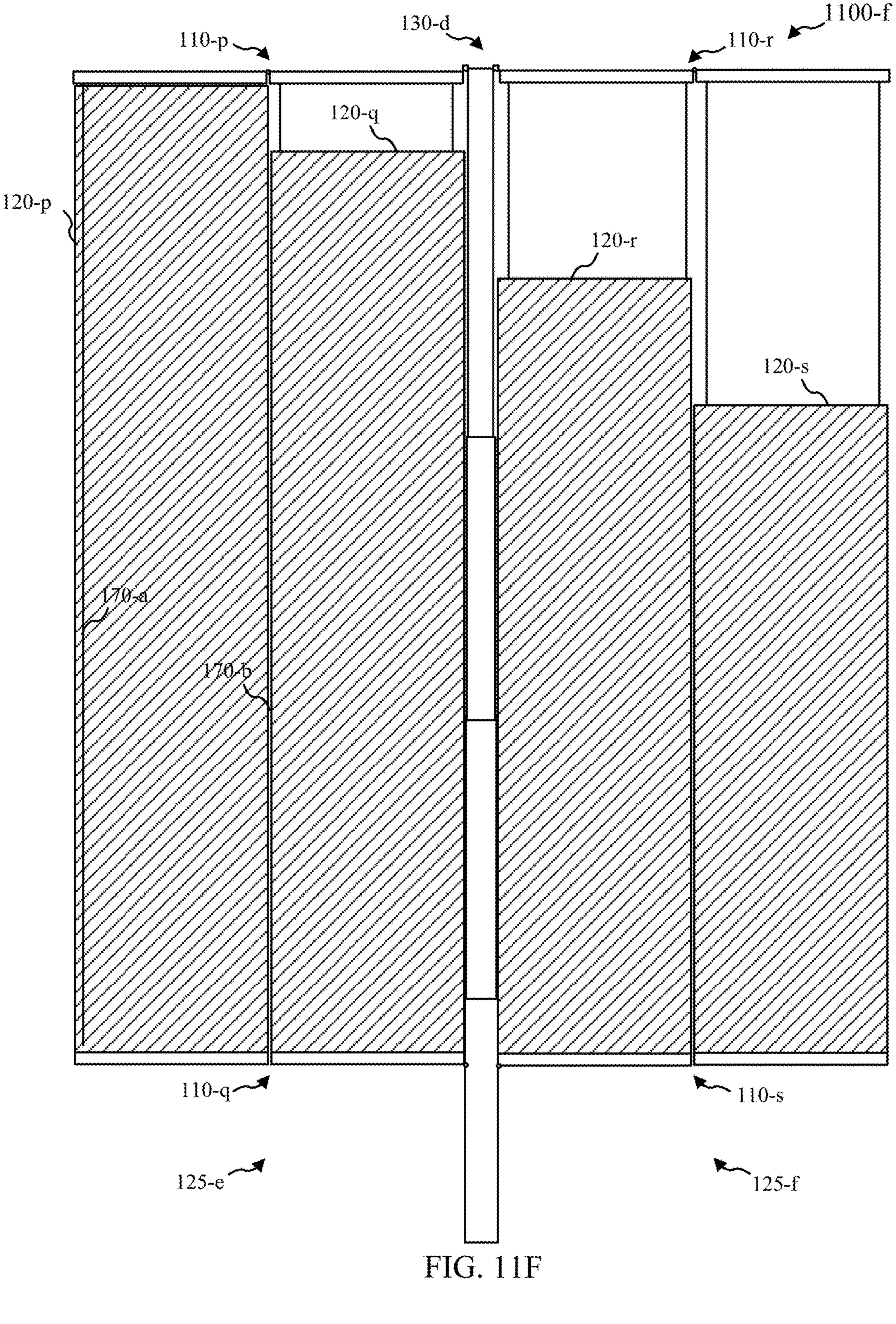

FIG. 11F may show the extension of membranes 120-*p*, 120-*q*, 120-*r*, and/or 120-*s*. This configuration may be such that the membranes may be deployed separately, as shown in the figure, though in some configurations, the membranes may be deployed in unison. Membranes 120-*p*, 120-*q*, 120-*r*, and 120-*s* may also be retracted in some cases, as may be the other components of system 11004, such as the extendible central column 130-*d* and/or foldable membrane supports 110-*p*, 110-*q*, 110-*r*, and 110-*s*.

As shown in this sequences of figures, the extendible central column 130-*d* may be extended in a longitudinal direction with respect to the unfolded foldable membrane supports 110-*q* and 110-*s* in the linear configuration. Unfolded foldable membrane supports 110-*p* and 110-*r* in the linear configuration may move longitudinally with respect to one or more of the other unfolded foldable membrane supports 110-*q* and 110-*s* in the linear configuration as the extendible central column 130-*d* may be extended.

With respect to FIG. 11A, FIG. 11B, FIG. 11C, FIG. 11E, and/or FIG. 11F, in some embodiments, the one or more foldable membrane supports 110-*p*, 110-*q*, 110-*r*, and/or 110-*s* include a first foldable membrane support 110-*p* (or 110-*r*) and a second membrane support 110-*q* (or 110-*s*), where each of the foldable membrane supports includes at least two segments 113-*p*-1/113-*p*-2 and 113-*q*-1/113-*q*-2, respectively (similarly for supports 110-*r* and 110-*s* with segments 113-*r*-1/113-*r*-2 and 113-*s*-1/113-*s*-2, respectively); the first foldable membrane support 110-*p* (or 110-*r*) and the second foldable membrane support 110-*q* (or 110-*s*) may be configured to extend from a first side (or second side) of an extendible central column 130-*d*.

In some embodiments, each of the one or more foldable membrane supports 110-*p*, 110-*q*, 110-*r*, and/or 110-*s* includes two or more segments 113-*p*-1/113-*p*-2, 113-*q*-1/113-*q*-2, 113-*r*-1/113-*r*-2 and 113-*s*-1/113-*s*-2, respectively, of each of the one or more foldable membrane supports may be configured as at least V-fold configurations. In some embodiments, each of the V-fold configurations is configured at least to stow on a respective side of an extendible central column 130-*d* or to extend from the respective side of the extendible central column 130-*d*. In some embodiments, the two or more segments (e.g., 113-*p*-1/113-*p*-2, 113-*q*-1/113-*q*-2, 113-*r*-1/113-*r*-2, and/or 113-*s*-1/113-*s*-2) of each of the one or more foldable membrane supports (e.g., 110-*p*, 110-*q*, 110-*r*, and/or 110-*s*) are configured to deploy from a folded configuration to a linear configuration, where each linear configuration is configured to extend in a respective direction perpendicular to an extendible central column 130-*d*. In some embodiments, each of the one or more foldable membrane supports 110-*p*, 110-*q*, 110-*r*, and/or 110-*s* includes a first segment (113-*p*-2, 113-*q*-2, 113-*r*-2 and/or 113-*s*-2), and a second segment (113-*p*-1, 113-*q*-1, 113-*r*-1 and/or 113-*s*-1), where a first end portion of the first segment of a respective foldable membrane support may be configured to coupled with an extendible central column 130-*d*; and/or a second end portion of the first segment of the respective foldable membrane support may be coupled with a first end portion of the second segment of the respective foldable membrane support. In some embodiments, each of the one or more foldable membrane supports 110-*p*, 110-*q*, 110-*r*, and/or 110-*s* is configured to unfold and extend in a respective linear direction perpendicular to an extendible central column 130-*d*.

Also as may be shown in this sequence of figures, the one or more membranes 120-*p*, 120-*q*, 120-*r*, and 120-*s* may be extended in the longitudinal direction after the extendible central column 130-*d* may be extended; at least a portion of each of the one or more membranes 120-*p*, 120-*q*, 120-*r*, and 120-*s* may be coupled with a portion of at least one of the one or more foldable membrane supports 110-*p*, 110-*q*, 110-*r*, and 110-*s*. In some embodiments, the one or more membranes 120-*p*, 120-*q*, 120-*r*, and 120-*s* may be extended in the longitudinal direction as the extendible central column 130-*d* may be extended.

Figure 12A:
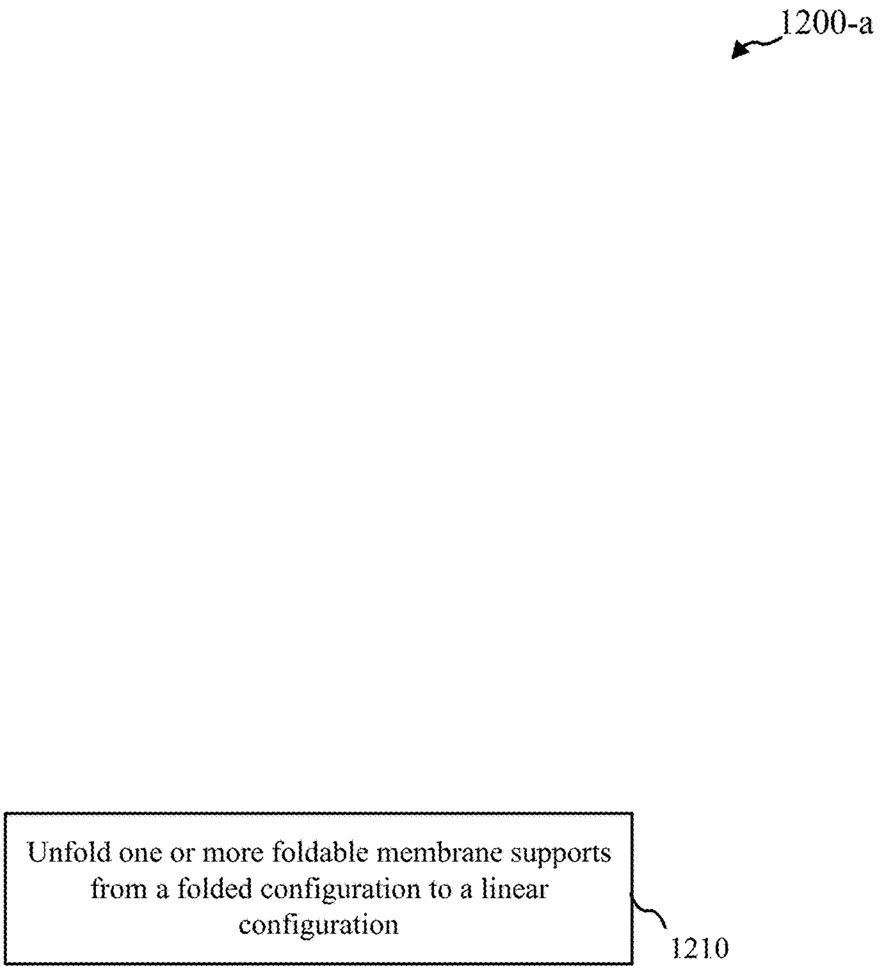
FIG. 12A shows a flow diagram of a method in accordance with various embodiments.

FIG. 12A shows a flow diagram of a method 1200-*a* in accordance with various embodiments. Method 1200-*a* may be implemented utilizing a variety of systems and/or devices such as those shown and/or described with respect to system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, system 700-*c* of FIG. 7C, device 800 of FIG. 8, device 900-*a* of FIGS. 9A-9C, device 900-*d* of FIGS. 9D-F, device 1000 of FIGS. 10A-C, and/or system 1100 of FIGS. 11A-11F. In FIG. 12A, the specific selection of steps shown and the order in which they are shown is intended merely to be illustrative. It is possible for certain steps to be performed in alternative orders, for certain steps to be omitted, and for certain additional steps to be added according to different embodiments of the invention. Some but not all of these variants are noted in the description that follows.

At block 1210, one or more foldable membrane supports may be unfolded from a folded configuration to a linear configuration. The method 1200-*a* may include coupling at least a portion of at least one of the one or more foldable membrane supports with an extendible central column.

Some embodiments of method 1200-*a* further include extending the extendible central column in a longitudinal direction with respect to at least one of the unfolded foldable membrane supports in the linear configuration. At least one of the one or more unfolded foldable membrane supports in the linear configuration may move longitudinally with respect to one or more of the other unfolded foldable membrane supports in the linear configuration as the extendible central column may be extended.

Some embodiments of method 1200-*a* include extending the one or more membranes in the longitudinal direction as the extendible central column may be extended; at least a portion of each of the one or more membranes may be coupled with a portion of at least one of the one or more foldable membrane supports. Some embodiments of method 1200-*a* include extending the one or more membranes in the longitudinal direction after the extendible central column may be extended; at least a portion of each of the one or more membranes may be coupled with a portion of at least one of the one or more foldable membrane supports.

Some embodiments of method 1200-*a* include retracting at least the extendible central column, the one or more unfolded foldable membrane supports, or the one or more membranes. The one or more membranes may include one or more photovoltaic arrays.

Some embodiments of the method 1200-*a* include moving two or more of the unfolded foldable membrane supports away from each other. Some embodiments further include deploying the one or more membranes between the two or more of the unfolded foldable membrane supports. Deploying the one or more membranes between the two or more of the unfolded foldable membrane supports may occur after moving the two or more of the unfolded foldable membrane supports away from each other. Deploying the one or more membranes between the two or more of the unfolded foldable membrane supports may occur as two or more of the unfolded foldable membrane supports are moved away from each other. Some embodiments include retracting the one or more membranes.

In some embodiments of the method 1200-*a*, one or more of the one or more unfoldable membrane supports includes two or more segments coupled with each other. In some embodiments, the one or more foldable membrane supports are configured to couple with an extendible central column. In some embodiments, the one or more foldable membrane supports may unfold from at least a V-fold configuration to a linear configuration. The one or more foldable membrane supports unfold from at least a Z-fold configuration to a linear configuration.

In some embodiments of the method 1200-*a*, the one or more foldable membrane supports include a first foldable membrane support, a second membrane support, a third membrane support, and a fourth membrane support, wherein each of the foldable membrane supports includes at least two segments and/or the first foldable membrane support and the second foldable membrane support are configured to extend from a first side of the extendible central column and/or the third foldable membrane support and the fourth foldable membrane support are configured to extend from a second side of the extendible central column.

In some embodiments of the method 1200-*a*, each of the V-fold configurations is configured at least to stow on a respective side of the extendible central column or to extend from the respective side of the extendible central column. In some embodiments, the two or more segments of each of the one or more foldable membrane supports are configured to deploy from a folded configuration to a linear configuration, wherein each linear configuration extends in a respective direction perpendicular to the extendible central column. In some embodiments, each of the one or more foldable membrane supports includes a first segment and a second segment, wherein: a first end portion of the first segment of a respective foldable membrane support is coupled with the extendible central column and/or a second end portion of the first segment of the respective foldable membrane support is coupled with a first end portion of the second segment of the respective foldable membrane support. In some embodiments, each of the one or more foldable membrane supports is configured to unfold and extend in a respective linear direction perpendicular to the extendible central column.

Figure 12B:
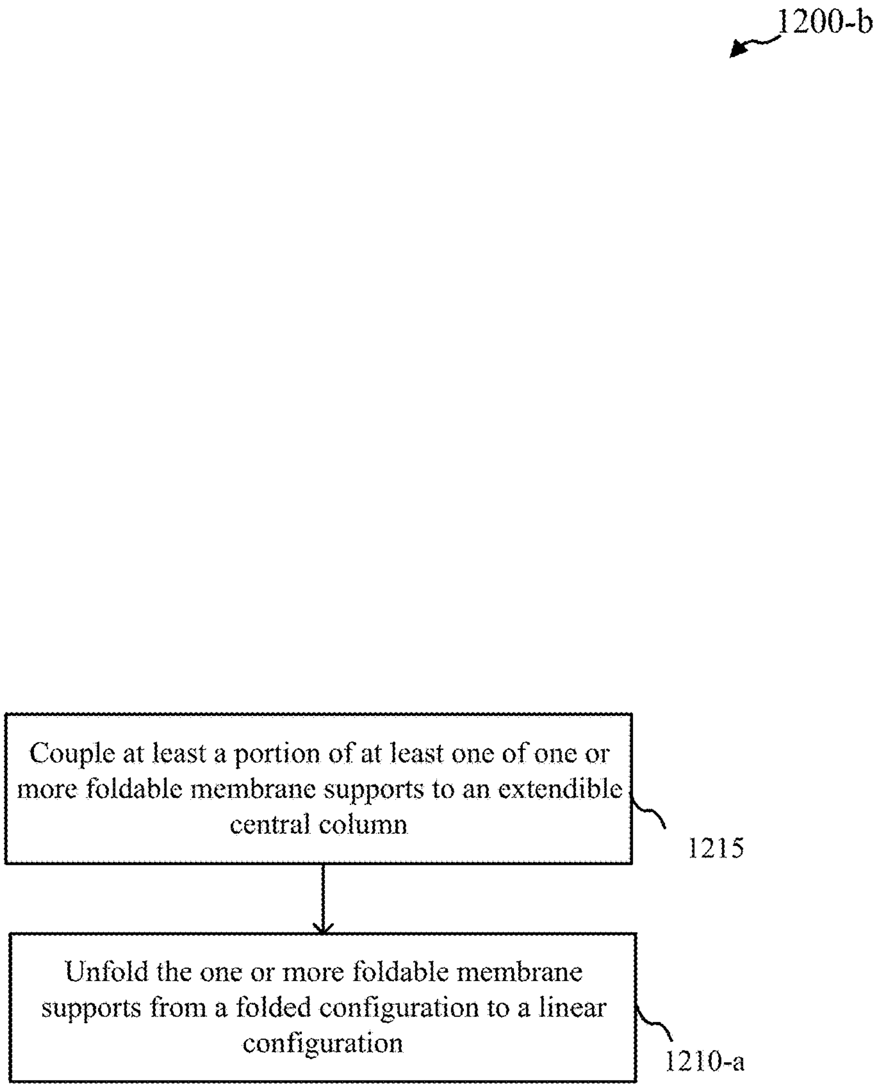
FIG. 12B shows a flow diagram of a method in accordance with various embodiments.

FIG. 12B shows a flow diagram of a method 1200-*b* in accordance with various embodiments. Method 1200-*b* may be implemented utilizing a variety of systems and/or devices such as those shown and/or described with respect to system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C, device 800 of FIG. 8, device 900-*a* of FIGS. 9A-9C, device 900-*d* of FIGS. 9D-F, device 1000 of FIGS. 10A-C, and/or system 1100 of FIGS. 11A-11F. Method 1200-*b* may be an example of method 1200-*a* of FIG. 12A. In FIG. 12B, the specific selection of steps shown and the order in which they are shown is intended merely to be illustrative. It is possible for certain steps to be performed in alternative orders, for certain steps to be omitted, and for certain additional steps to be added according to different embodiments of the invention. Some but not all of these variants are noted in the description that follows.

At block 1210-*a*, one or more foldable membrane supports may be unfolded from a folded configuration to a linear configuration. At block 1215, at least a portion of each of the one or more foldable membrane supports may be coupled with an extendible central column.

Figure 12C:
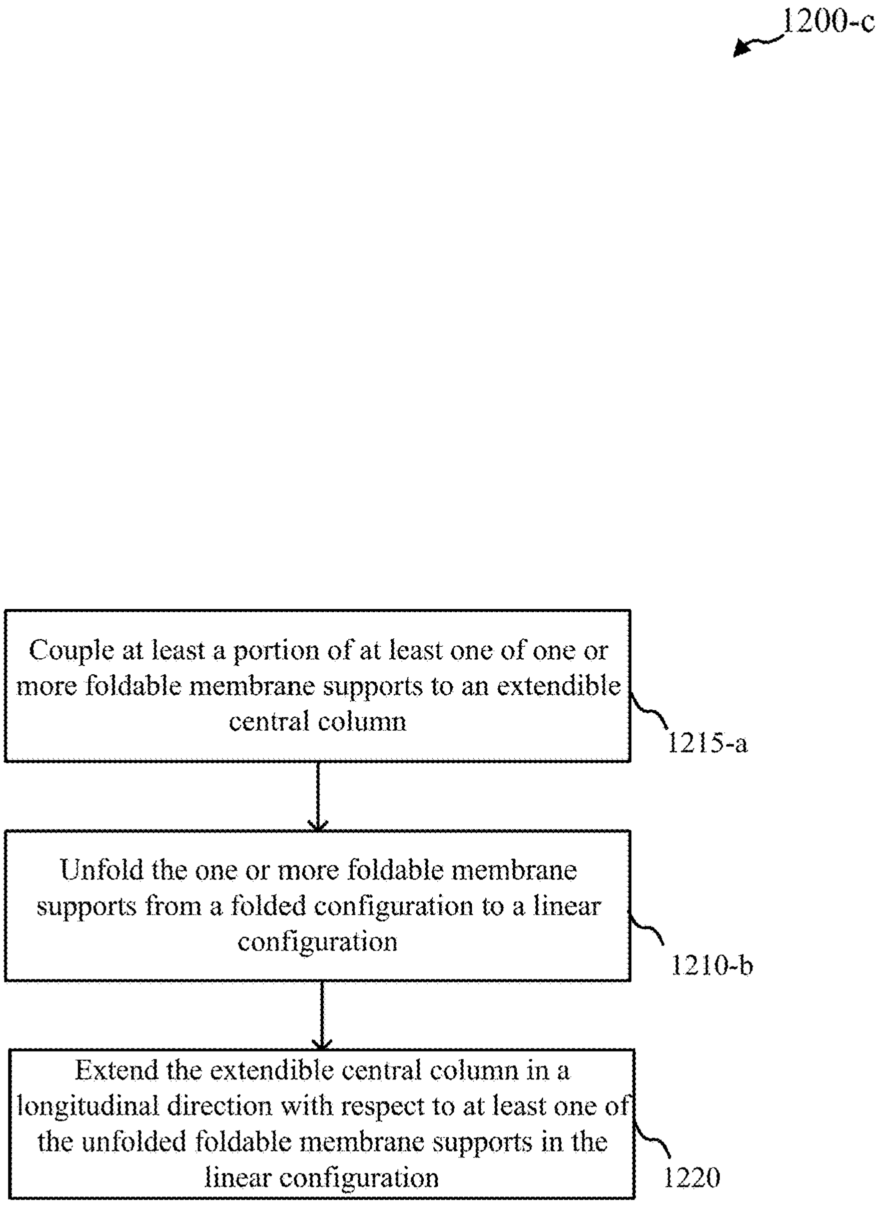
FIG. 12C shows a flow diagram of a method in accordance with various embodiments.

FIG. 12C shows a flow diagram of a method 1200-*c* in accordance with various embodiments. Method 1200-*c* may be implemented utilizing a variety of systems and/or devices such as those shown and/or described with respect to system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C, device 800 of FIG. 8, device 900-*a* of FIGS. 9A-9C, device 900-*d* of FIGS. 9D-F, device 1000 of FIGS. 10A-C, and/or system 1100 of FIGS. 11A-11F. Method 1200-*c* may be an example of method 1200-*a* of FIG. 12A and/or method 1200-*b* of FIG. 12B. In FIG. 12C, the specific selection of steps shown and the order in which they are shown is intended merely to be illustrative. It is possible for certain steps to be performed in alternative orders, for certain steps to be omitted, and for certain additional steps to be added according to different embodiments of the invention. Some but not all of these variants are noted in the description that follows.

At block 1210-*b*, one or more foldable membrane supports may be unfolded from a folded configuration to a linear configuration. At block 1215-*a*, at least a portion of at least one of the one or more foldable membrane supports may be coupled with an extendible central column. At block 1220, the extendible central column may be extended in a longitudinal direction with respect to at least one of the unfolded foldable membrane supports in the linear configuration.

Figure 12D:
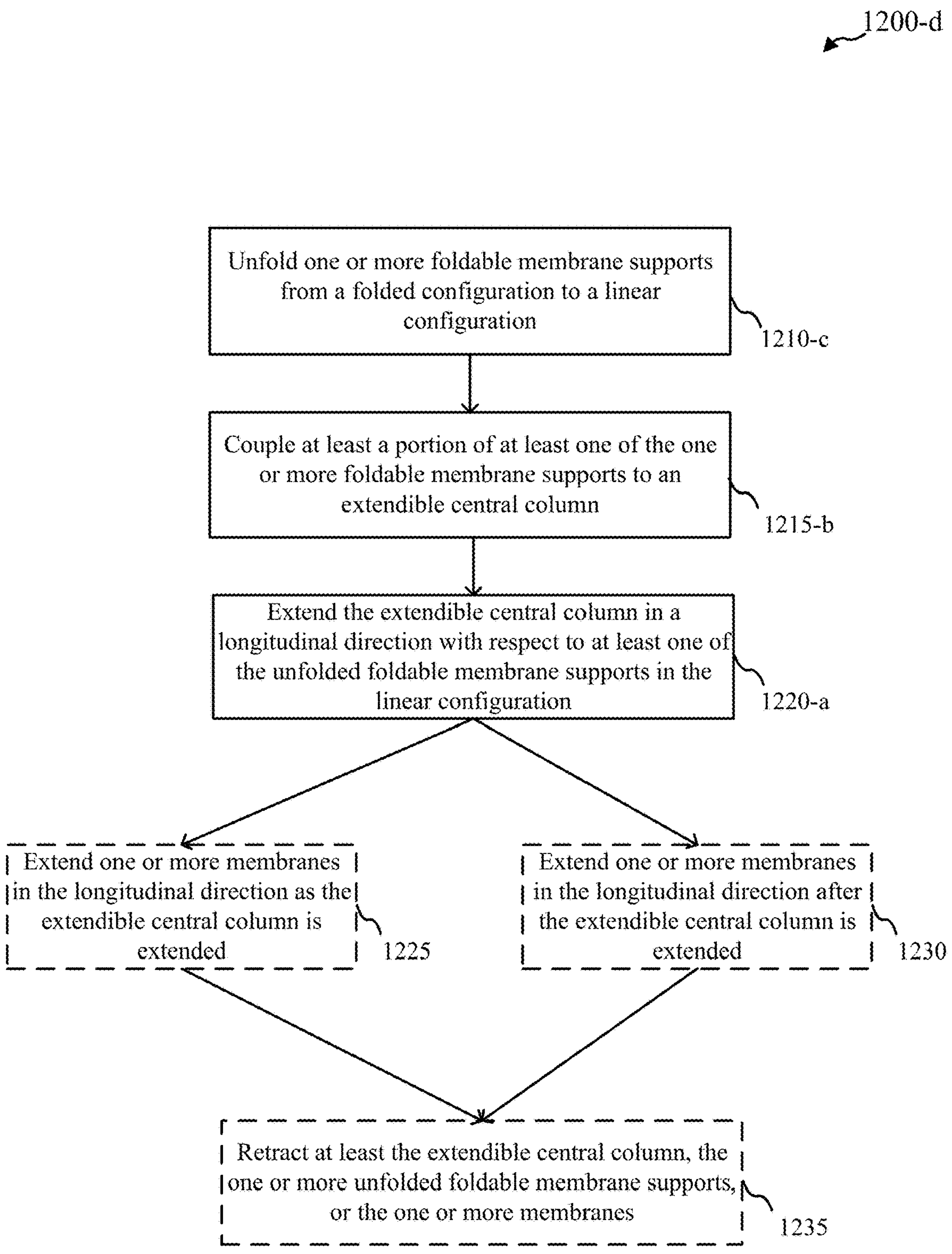
FIG. 12D shows a flow diagram of a method in accordance with various embodiments.

FIG. 12D shows a flow diagram of a method 1200-*d* in accordance with various embodiments. Method 1200-*d* may be implemented utilizing a variety of systems and/or devices such as those shown and/or described with respect to system 100 of FIG. 1, system 200 of FIGS. 2A-2F, system 300 of FIG. 3, system 400-*a* of FIG. 4A, system 400-*b* of FIG. 4B, system 500-*a* of FIG. 5A, system 500-*b* of FIG. 5B, system 500-*c* of FIG. 5C, system 600-*a* of FIG. 6A, system 700-*a* of FIG. 7A, system 700-*b* of FIG. 7B, and/or system 700-*c* of FIG. 7C, device 800 of FIG. 8, device 900-*a* of FIGS. 9A-9C, device 900-*d* of FIGS. 9D-F, device 1000 of FIGS. 10A-C, and/or system 1100 of FIGS. 11A-11F. Method 1200-*d* may be an example of method 1200-*a* of FIG. 12A, method 1200-*b* of FIG. 12B, and/or method 1200-*c* of FIG. 12C. In FIG. 12D, the specific selection of steps shown and the order in which they are shown is intended merely to be illustrative. It is possible for certain steps to be performed in alternative orders, for certain steps to be omitted, and for certain additional steps to be added according to different embodiments of the invention. Some but not all of these variants are noted in the description that follows.

At block 1210-*c*, one or more foldable membrane supports may be unfolded from a folded configuration to a linear configuration. At block 1215-*b*, at least a portion of at least one of the one or more foldable membrane supports may be coupled with an extendible central column. At block 1220-*a*, the extendible central column may be extended in a longitudinal direction with respect to at least one of the unfolded foldable membrane supports in the linear configuration.

In some embodiments of method 1200-*d*, one or more membranes may be extended in the longitudinal direction as the extendible central column is extended as shown in block 1225. The one or more membranes may include photovoltaic arrays. In some embodiments of method 1200-*d*, one or more membranes may be extended in the longitudinal direction after the extendible central column is extended as shown in block 1230. Block 1235 shows that in some embodiments at least the extendible central column, the one or more unfolded foldable membrane supports, or the one or more membranes may be retracted. In some cases, these one or more components may be retracted together, though in some embodiments, the components may be able to be independently retracted.

These embodiments may not capture the full extent of combination and permutations of materials and process equipment. However, they may demonstrate the range of applicability of the method, devices, and/or systems. The different embodiments may utilize more or less stages than those described.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various stages may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the embodiments.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which may be depicted as a flow diagram or block diagram or as stages. Although each may describe the operations as a sequential process, many of the operations can be performed in parallel or concurrently. In addition, the order of the operations may be rearranged. A process may have additional stages not included in the figure.

Having described several embodiments, it will be recognized by those of skill in the art that various modifications, alternative constructions, and equivalents may be used without departing from the spirit of the different embodiments. For example, the above elements may merely be a component of a larger system, wherein other rules may take precedence over or otherwise modify the application of the different embodiments. Also, a number of stages may be undertaken before, during, or after the above elements are considered. Accordingly, the above description should not be taken as limiting the scope of the different embodiments, which may be defined by the appended claims.

What is claimed is:

1. An extendible membrane system comprising:

an extendible central column;

a first membrane;

a second membrane;

a first foldable membrane support that includes a first segment of the first foldable membrane support and a second segment of the first foldable membrane support, wherein a first end portion the first segment of the first foldable membrane support is coupled with a first end portion of the second segment of the first foldable membrane support utilizing at least a hinge or a latch; and a second foldable membrane support that includes a first segment of the second foldable membrane support and a second segment of the second foldable membrane support, wherein a first end portion of the first segment of the second foldable membrane support is coupled with a first end portion of the second segment of the second foldable membrane support utilizing at least a hinge or a latch, wherein:

the first foldable membrane support and the second foldable membrane support are configured to support the first membrane and the second membrane such that:

the first segment of the first foldable membrane support is coupled with a first end of the first membrane and the second segment of the first foldable membrane support is coupled with a first end of the second membrane; and the first segment of the second foldable membrane support is coupled with a second end of the first membrane and the second segment of the second foldable membrane support is coupled with a second end of the second membrane; and the first foldable membrane support and the second foldable membrane support extend from the central column, wherein the first foldable membrane support and the second foldable membrane support are configured to unfold and extend in a respective linear direction perpendicular to the extendible central column such that:

the first segment of the first foldable membrane support and the second segment of the first foldable membrane support extend off a first side of the extendible central column;

the first segment of the second foldable membrane support and the second segment of the second foldable membrane support extend off the first side of the extendible central column; and a second portion of the first foldable membrane support is coupled with the extendable central column utilizing at least a hinge or a latch such that the first foldable membrane support travels with a portion of the extendible central column during deployment and a second portion of the second foldable membrane support is coupled with the extendible central column utilizing at least a hinge or a latch such that second foldable membrane support remains stationary with respect to the extendible central column.

2. The system of claim 1, wherein the first foldable membrane support, the second foldable membrane support, the first membrane, and the second membrane are configured to store in a sandwiched configuration with the first membrane folded in an accordion configuration between the first segment of the first foldable membrane support and the first segment of the second foldable membrane and the second membrane folded in an accordion configuration between the second segment of the first foldable membrane support and the second segment of the second foldable membrane support.

3. The system of claim 1, further comprising a third foldable membrane support and a fourth foldable membrane support positioned on an opposite side of the extendible central column with respect to the first foldable membrane support and the second foldable membrane support.

4. The system of claim 3, wherein a total combined tension in the first membrane, second membrane, third membrane, and fourth membrane is less than or equal to 30% of the deployed compression strength of the extendible central column in a deployed state.

5. The system of claim 1, wherein the extendible central column includes a telescoping truss column.

6. The system of claim 1, wherein the extendible central column includes at least a rollable column, a foldable column, a coilable column, or an articulated truss column.

7. The system of claim 1, wherein the extendible central column includes a lattice structure.

8. The system of claim 1, wherein the first membrane and the second membrane include one or more photovoltaic arrays.

9. The system of claim 1, wherein the first membrane is configured to fold up between the first segment of the first foldable membrane support and the first segment of the second foldable membrane and the second membrane is configured to fold up between the second segment of the first foldable membrane support and the second segment of the second foldable membrane support.

10. The system of claim 1, wherein the first membrane is configured to roll up between the first segment of the first foldable membrane support and the first segment of the second foldable membrane and the second membrane is configured to roll up between the second segment of the first foldable membrane support and the second segment of the second foldable membrane support.

11. The system of claim 1, further comprising one or more guy wires coupled with at least a portion of the extendible central column and with at least a portion of the first foldable membrane support and the second foldable membrane support.

12. The system of claim 11, wherein at least one of the one or more guy wires is positioned out of plane with respect to a plane defined by the first membrane and the second membrane in an extended state.

13. The system of claim 1, further comprising a third membrane support and a fourth membrane support, wherein:

the first foldable membrane support and the second foldable membrane support are configured to extend from a first side of the extendible central column; and the third foldable membrane support and the fourth foldable membrane support are configured to extend from a second side of the extendible central column.

14. The system of claim 1, wherein the first foldable membrane support and the second foldable membrane support are configured as V-fold configurations.

15. The system of claim 14, wherein each of the V-fold configurations is configured to stow on a respective side of the extendible central column.

16. The system of claim 1, wherein the first foldable membrane support and the second foldable membrane support are configured to deploy from a folded configuration to a linear configuration, wherein each linear configuration extends in a respective direction perpendicular to the extendible central column.

17. The system of claim 1, wherein the first foldable membrane support and the second foldable membrane support are configured to unfold and extend in a respective linear direction perpendicular to the extendible central column.

18. The system of claim 1, wherein the first foldable membrane support includes a third segment to form a Z-fold configuration with the first segment of the first foldable membrane support and the second segment of the first foldable membrane support.

19. The system of claim 1, wherein the first foldable membrane support, the second foldable membrane support, the first membrane, and the second membrane are configured such that the first membrane and the second membrane deploy from a stowed state to a deployed state after the extendible central column is extended.

20. The system of claim 1, wherein the extendible central column includes a split tube boom.

* * * * *